United States Patent
Uematsu

(10) Patent No.: US 7,885,092 B2
(45) Date of Patent: Feb. 8, 2011

(54) SEMICONDUCTOR STORAGE DEVICE AND OPERATION METHOD THEREOF

(75) Inventor: Masaya Uematsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 178 days.

(21) Appl. No.: 12/389,836

(22) Filed: Feb. 20, 2009

(65) Prior Publication Data

US 2009/0231908 A1 Sep. 17, 2009

(30) Foreign Application Priority Data

Mar. 11, 2008 (JP) .............................. 2008-060739

(51) Int. Cl.
*G11C 11/00* (2006.01)
(52) U.S. Cl. .................. 365/154; 365/156; 365/188; 365/189.16; 365/205
(58) Field of Classification Search ................. 365/154, 365/156, 188, 189.05, 205
See application file for complete search history.

(56) References Cited

U.S. PATENT DOCUMENTS

| | | | | |
|---|---|---|---|---|
| 5,742,557 A | * | 4/1998 | Gibbins et al. ......... | 365/230.05 |
| 5,764,565 A | * | 6/1998 | Sato et al. .................... | 365/154 |
| 5,808,933 A | * | 9/1998 | Ross et al. ................... | 365/156 |
| 5,831,896 A | | 11/1998 | Lattimore et al. | |
| 7,069,541 B2 | * | 6/2006 | Dougherty et al. .......... | 717/122 |
| 7,196,945 B2 | * | 3/2007 | Kato ..................... | 365/189.07 |
| 7,420,836 B1 | * | 9/2008 | Kim et al. .................... | 365/154 |
| 7,499,312 B2 | * | 3/2009 | Matick et al. ............... | 365/154 |
| 7,672,152 B1 | * | 3/2010 | Kulkarni et al. ............. | 365/154 |
| 7,706,174 B2 | * | 4/2010 | Pradhan et al. ............. | 365/156 |
| 7,733,689 B2 | * | 6/2010 | Kim et al. .................... | 365/154 |
| 7,782,654 B2 | * | 8/2010 | Hayashi et al. ............. | 365/154 |

FOREIGN PATENT DOCUMENTS

| | | |
|---|---|---|
| JP | 54-022133 | 2/1979 |
| JP | 57-141097 | 9/1982 |
| JP | 03-252992 | 11/1991 |

OTHER PUBLICATIONS

Japanese Office Action issued on Jan. 5, 2010 in connection with counterpart JP Application No. 2008-060739.

* cited by examiner

*Primary Examiner*—Viet Q Nguyen
(74) *Attorney, Agent, or Firm*—SNR Denton US LLP

(57) ABSTRACT

A semiconductor storage device includes: a bit line; a first word line; a second word line; a first inverter in which one terminal of a first load transistor is connected to a first driver transistor and their junction point forms a first node; a second inverter in which one terminal of a second load transistor is connected to a second driver transistor and their junction point forms a second node; a first write transistor one terminal of which is connected to the first load transistor and the other terminal of which is connected to a power supply voltage; a second write transistor one terminal of which is connected to the first driver transistor and the other terminal is connected to a reference potential; and an access transistor one terminal of which is connected to the first node and the other terminal of which is connected to the bit line.

8 Claims, 23 Drawing Sheets

OPERATIONS OF DRIVERS

| | INPUT SIGNAL | | WRITE DRIVER 1 | WRITE DRIVER 2 | DUMMY DRIVER | |
|---|---|---|---|---|---|---|
| | WE | CL | WL1 | WL2 | DWL1 | DWL2 |
| WRITE OPERATION | LOW | HIGH | HIGH | HIGH | – | – |
| READ OPERATION | HIGH | HIGH | HIGH | LOW | HIGH | LOW |
| DATA HOLDING | – | LOW | LOW | HIGH | – | – |

WRITE OPERATION IS PERFORMED WHEN WE=LOW

DATA HOLDING STATE

SRAM CELL ACCORDING TO THE EMBODIMENT

DATA HOLDING STATE

6 Tr SRAM CELL

DATA WRITE OPERATION (1 → 0)

SRAM CELL ACCORDING TO THE EMBODIMENT

DATA WRITE OPERATION (1 → 0)

6 Tr SRAM CELL

DATA WRITE OPERATION (0 → 1)

SRAM CELL ACCORDING TO THE EMBODIMENT

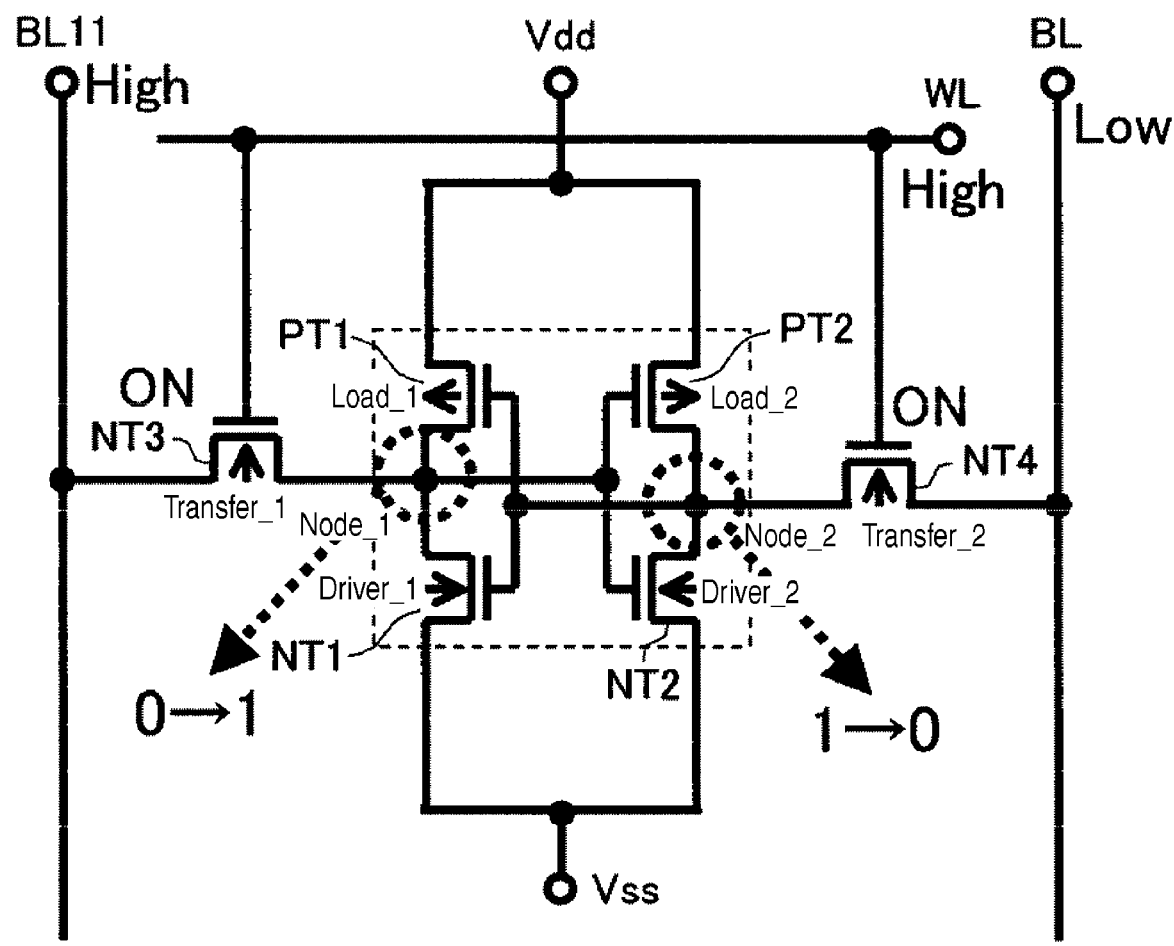

DATA READ OPERATION

SRAM CELL ACCORDING TO THE EMBODIMENT

DATA READ OPERATION

6 Tr SRAM CELL

Tr WHICH REQUIRES CONTROL OF CHARACTERISTIC VARIATIONS

INVERTER AFFECTED BY TRANSFER Tr

INVERTER NOT AFFECTED BY TRANSFER Tr

Cell Layout (AA~M1)

Cell Layout (M1~M2)

Cell Layout (M2~M3)

Cell Layout (M3~M4)

SEMICONDUCTOR STORAGE DEVICE AND OPERATION METHOD THEREOF

CROSS REFERENCE TO RELATED APPLICATIONS

The present invention contains subject matter related to Japanese Patent Application JP 2008-060739 filed in the Japanese Patent Office on Mar. 11, 2008, the entire contents of which being incorporated herein by reference.

BACKGROUND OF THE INVENTION

1. Field of the Invention

The invention relates to a semiconductor storage device which operates at low voltage and an operation method thereof, and particularly relates to a semiconductor storage device having a static memory cell formed by transistors as a memory cell, that is, a circuit of a static memory (Static Random Access Memory: hereinafter, abbreviated as SRAM) which is suitable for low voltage.

2. Description of the Related Art

The SRAM is widely used as a general-purpose memory-logic integrated memory. Particularly, the SPAM including p-channel MOS (PMOS) transistors PT1, PT2 as load transistors, n-channel MOS (NMOS) transistors NT1, NT2 as driver transistors and NMOS transistors NT3, NT4 as access transistors (hereafter, abbreviated as 6Tr-SRAM) has high affinity for a logic process and is widely used as a memory which can operate at high speed.

However, as miniaturization of a semiconductor integrated circuit advances as well as the cell area of the SRAM is reduced in recent years, there is a problem of effects of characteristic variations of MOS transistors with respect to operational stability of the SRAM.

As a method of suppressing power consumption of the semiconductor integrated circuit, there is a method in which the SRAM is driven at high voltage at the time of high-speed operation and the SRAM is driven at low voltage at the time of low-speed operation or at the time of standby.

In this case, operation at lower voltage than a power supply voltage (Vdd) to be supplied to the SRAM is necessary, therefore, margin of operational stability is reduced, which further increases effects of characteristic variations of MOS transistors.

FIG. 2 is a graph showing power supply voltage dependence of Static Noise Margin (hereinafter, abbreviated as SNM) indicating data holding stability of the 6Tr-SRAM.

As can be seen from FIG. 2, in the 6Tr-SRAM, as the power supply voltage is reduced, the SNM is reduced.

When the SNM is reduced, the data holding of the SRAM becomes unstable, and particularly, problems such that data is improperly written at the time of reading operation occur.

FIG. 3 is a graph showing the SNM of the 6Tr-SRAM whose character variations of MOS transistors are large.

As shown in FIG. 3, curves of output characteristics of right-and-left nodes are imbalance and distorted due to variations of MOS transistors, which reduces the SNM.

As a method of reducing the effect of characteristic variations of MOS transistors, there is a method of using a 5Tr-SRAM (refer to U.S. Pat. No. 5,831,896 (Patent Document 1)) shown in FIG. 4.

The SRAM usually holds data at a flip-flop portion formed by a pair of inverters. A data holding characteristic at the flip-flop portion will be the one in which normal inverter curves are combined as shown in FIG. 5.

The 6Tr-SRAM reads data held in the flip-flop portion by connecting output portions (a first node ND1 and second node ND2) of first and second inverters INV1, INV 2 to a first bit line BL1 and a second bit line BL2 through first and second NMOS transistors NT3, NT4 for data access and by allowing the NMOS transistors NT3, NT4 for data access to be an ON state through a word line WL1.

SUMMARY OF THE INVENTION

However, in the 6Tr-SRAM, when the NMOS transistors NT3, NT4 for data access are in the ON state, the NMOS transistors NT3, NT4 for data access affect the characteristic of flip-flop portion, therefore, the 6Tr-SRAM will have the data holding characteristic as shown in FIG. 2, which is the characteristic having distortion as shown in FIG. 3 as characteristic variations of transistors increase.

Therefore, it is necessary that characteristic variations of all six transistors included in the SRAM are suppressed for obtaining large SNM in the 6Tr-SRAM.

On the other hand, in the 5Tr-SRAM of FIG. 4, the bit line is one, and the NMOS transistor for data access connected to the flip-flop portion is one, which allows the NMOS transistor affecting the data holding characteristic of the flip-flop portion to be one, as a result, the data holding characteristic as shown in FIG. 6 is obtained.

In order to obtain a large SNM in this characteristic, it is just necessary to suppress character variations of three transistors, namely, the NMOS transistor NT3 for data access, the NMOS transistor NT1 and the PMOS transistor PT1 forming the inverter to which the NT3 is connected, which reduces effects of character variations of the MOS transistors as compared with the 6Tr-SRAM.

However, in the 5Tr-SRAM, problems occur in data write operation.

The 6Tr-SRAM accesses the flip-flop portion through two bit lines and inverts data held in the flip-flop.

On the other hand, in the 5Tr-SRAM, it is necessary to invert data held in the flip-flop by one bit line, therefore, it is difficult to invert data from low (0 (zero)) to high (1) particularly at the time of low-voltage operation, which causes a write error.

Thus, it is desirable to provide a semiconductor storage device and an operation method thereof capable of reducing effects of characteristic variations of transistors as well as securing a data write operation margin, which allows a static memory cell to operate at low voltage stably.

A semiconductor storage device according to an embodiment of the invention includes a bit line, a first word line, a second word line, a first inverter in which one terminal of a first conductive-type first load transistor is connected to one terminal of a second conductive-type first driver transistor and a junction point therebetween forms a first node, a second inverter in which one terminal of a first conductive-type second load transistor is connected to one terminal of a second conductive-type second driver transistor and a junction point therebetween forms a second node, a first write transistor one terminal of which is connected to the other terminal of the first load transistor and the other terminal of which is connected to a power supply voltage, a second write transistor one terminal of which is connected to the other terminal of the first driver transistor and the other terminal is connected to a reference potential, and an access transistor which is a second conductive-type, one terminal of which is connected to the first node and the other terminal of which is connected to the bit line, in which control terminals of the first load transistor and the first driver transistor are connected to the second node, in which control terminals of second load transistor and the second driver transistor are connected to the first node, in which a control terminal of the first write transistor and a control terminal of the access transistor are connected to the first word line, and in which a control terminal of the second write transistor is connected to the second word line.

It is preferable that, at the time of a data holding state, the first write transistor is maintained in an ON state and the access transistor is maintained in an OFF state by the first word line and the second write transistor is maintained in an ON state by the second word line.

It is preferable that, at the time of a data write operation of a first level, the bit line is set at the first level, the first write transistor is maintained in an OFF state and the access transistor is maintained in an ON state by the first word line, and the second write transistor is maintained in an OFF state by the second word line.

It is preferable that, at the time of a data write operation of a second level, the bit line is set at the second level, the first write transistor is maintained in an OFF state and the access transistor is maintained in an ON state by the first word line, and the second write transistor is maintained in an OFF state by the second word line.

It is preferable that, at the time of a data read operation, the bit line is set at the second level, the first write transistor is maintained in an OFF state and the access transistor is maintained in an ON state by the first word line, and the second write transistor is maintained in an ON state by the second word line.

A semiconductor storage device according to an embodiment of the invention includes a memory cell array portion in which memory cells are arranged in a matrix state, first word lines and second word lines arranged at respective rows so as to correspond to row arrangement of the memory cells, bit lines arranged at respective columns so as to correspond to column arrangement of the memory cells, word drivers capable of setting levels of the selected first word line and the second word line respectively, and a column circuit capable of setting a potential of the selected bit line according to operations, in which the memory cell has a first inverter in which one terminal of a first conductive-type first load transistor is connected to one terminal of a second conductive-type first driver transistor and a junction point therebetween forms a first node, a second inverter in which one terminal of a first conductive-type second load transistor is connected to one terminal of a second conductive-type second driver transistor and a junction point therebetween forms a second node, a first write transistor one terminal of which is connected to the other terminal of the first load transistor and the other terminal of which is connected to a power supply voltage, a second write transistor one terminal of which is connected to the other terminal of the first driver transistor and the other terminal is connected to the reference potential, and an access transistor which is a second conductive-type, one terminal of which is connected to the first node and the other terminal of which is connected to the bit line, in which control terminals of the first load transistor and the first driver transistor are connected to the second node, in which control terminals of second load transistor and the second driver transistor are connected to the first node, in which a control terminal of the first write transistor and a control terminal of the access transistor are connected to a corresponding first word line, and in which a control terminal of the second write transistor is connected to a corresponding second word line.

An operation method of a semiconductor storage device according to an embodiment of the invention which has a bit line, a first word line, a second word line, a first inverter in which one terminal of a first conductive-type first load transistor is connected to one terminal of a second conductive-type first driver transistor and a junction point therebetween forms a first node, a second inverter in which one terminal of a first conductive-type second load transistor is connected to one terminal of a second conductive-type second driver transistor and a junction point therebetween forms a second node, a first write transistor one terminal of which is connected to the other terminal of the first load transistor and the other terminal of which is connected to a power supply voltage, a second write transistor one terminal of which is connected to the other terminal of the first driver transistor and the other terminal is connected to the reference potential, and an access transistor which is a second conductive-type, one terminal of which is connected to the first node and the other terminal of which is connected to the bit line, in which control terminals of the first load transistor and the first driver transistor are connected to the second node, in which control terminals of second load transistor and the second driver transistor are connected to the first node, in which a control terminal of the first write transistor and a control terminal of the access transistor are connected to the first word line, and in which a control terminal of the second write transistor is connected to the second word line, including the steps of maintaining the first write transistor in an ON state and maintaining the access transistor in an OFF state by the first word line as well as maintaining the second write transistor in an ON state by the second word line at the time of a data holding state, setting the bit line at a first level, maintaining the first write transistor in an OFF state and maintaining the access transistor in an ON state by the first word line as well as maintaining the second write transistor in an OFF state by the second word line at the time of a data write operation of the first level, setting the bit line at a second level, maintaining the first write transistor in an OFF state and maintaining the access transistor in an ON state by the first word line as well as maintaining the second write transistor in an OFF state by the second word line at the time of a data write operation of the second level, and setting the bit line at the second level, maintaining the first write transistor in an OFF state and maintaining the access transistor in an ON state by the first word line as well as maintaining the second write transistor in an ON state by the second word line at the time of a data read operation.

According to an embodiment of the invention, a static memory cell which operates stably even at a low voltage can be realized.

BRIEF DESCRIPTION OF THE DRAWINGS

FIG. 18A and FIG. 18B are views for explaining data write operation (0→1) of the SRAM cell according to the embodiment;

DESCRIPTION OF THE PREFERRED EMBODIMENTS

Hereinafter, embodiments of the invention will be explained with reference to the drawings.

Figure 1:
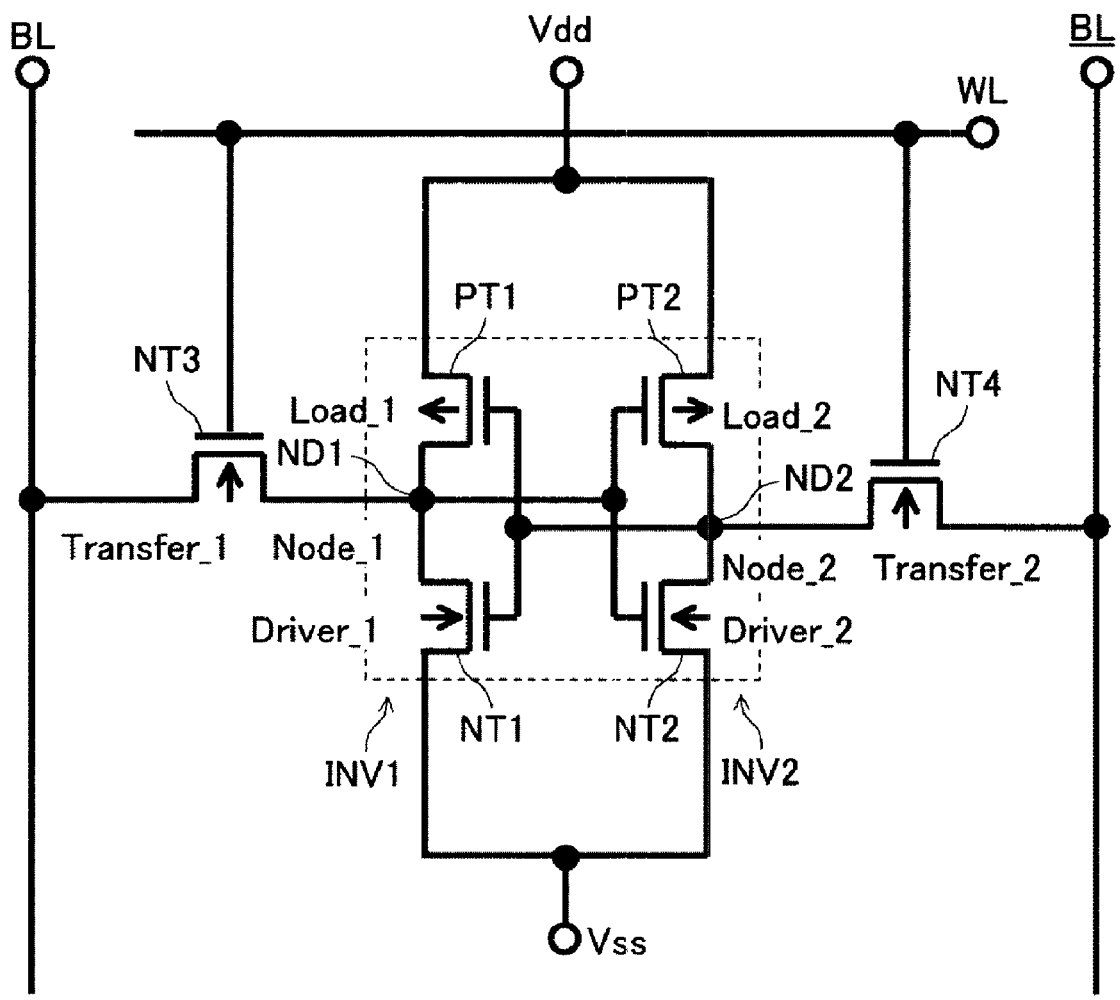
FIG. 1 is a circuit diagram showing a configuration of a SRAM (6Tr-SRAM) including 6 transistors.
Figure 2:
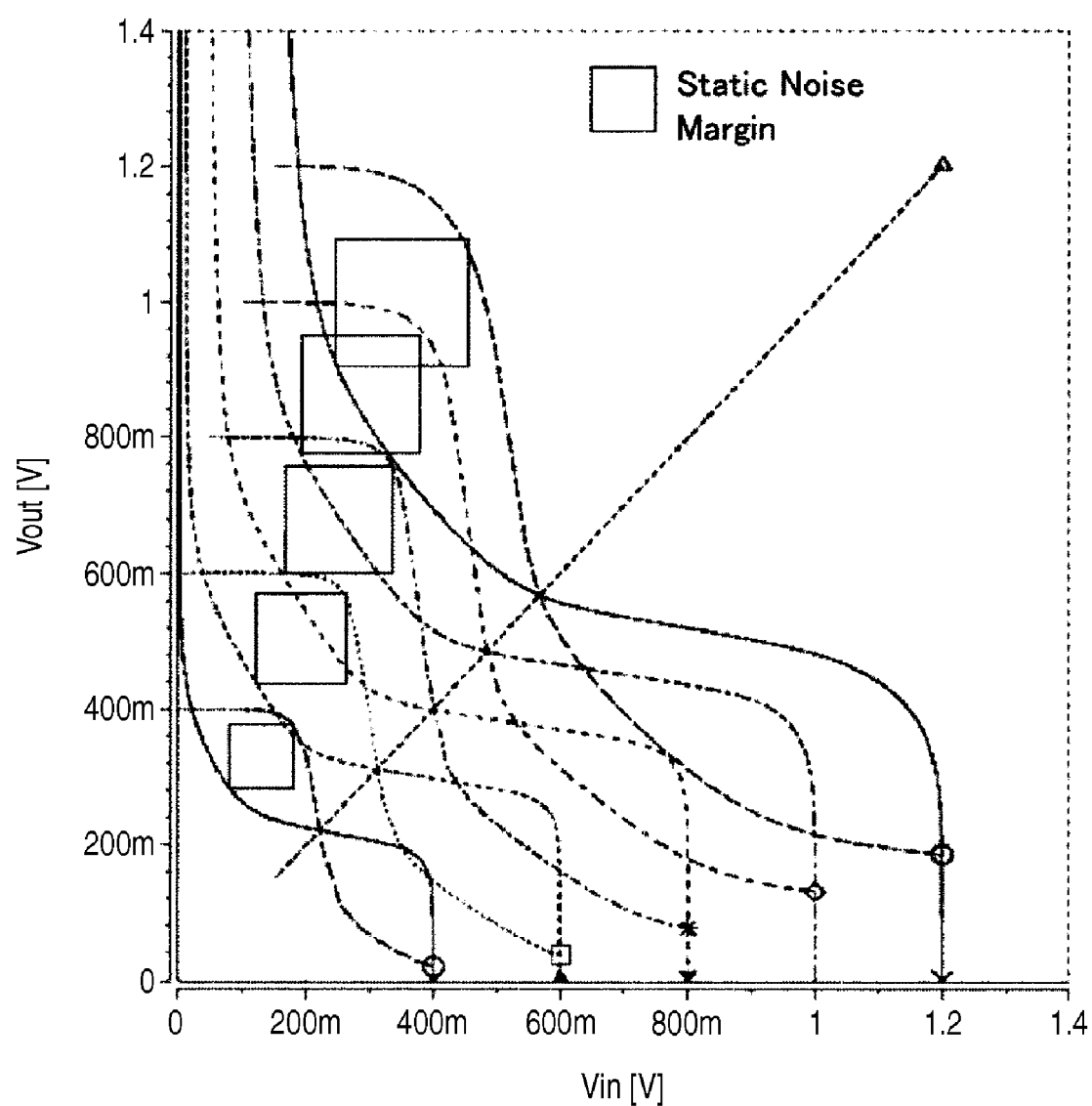
FIG. 2 is a graph showing power supply voltage dependence of a static noise margin indicating data holding stability of the 6Tr-SRAM.
Figure 3:
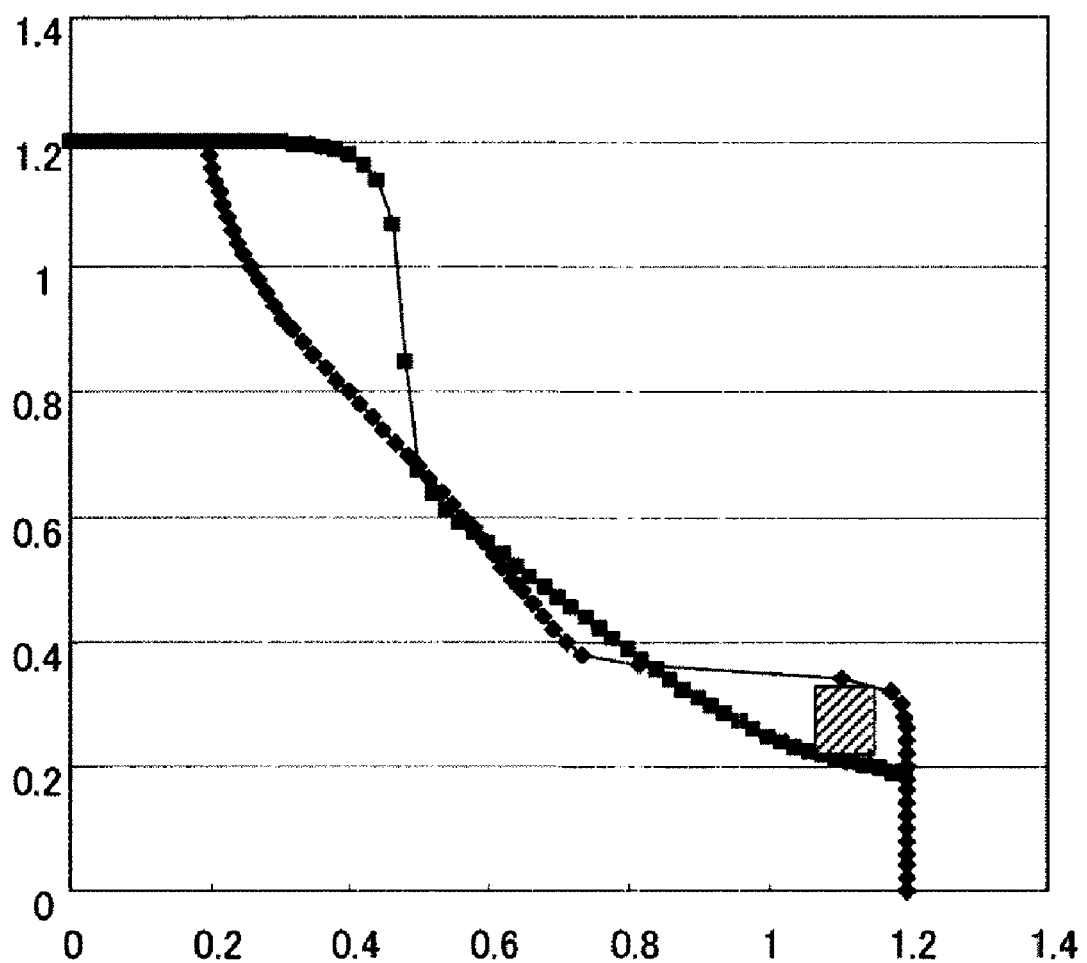
FIG. 3 is a graph showing the SNM of the 6Tr-SRAM whose character variations of MOS transistors are large.
Figure 4:
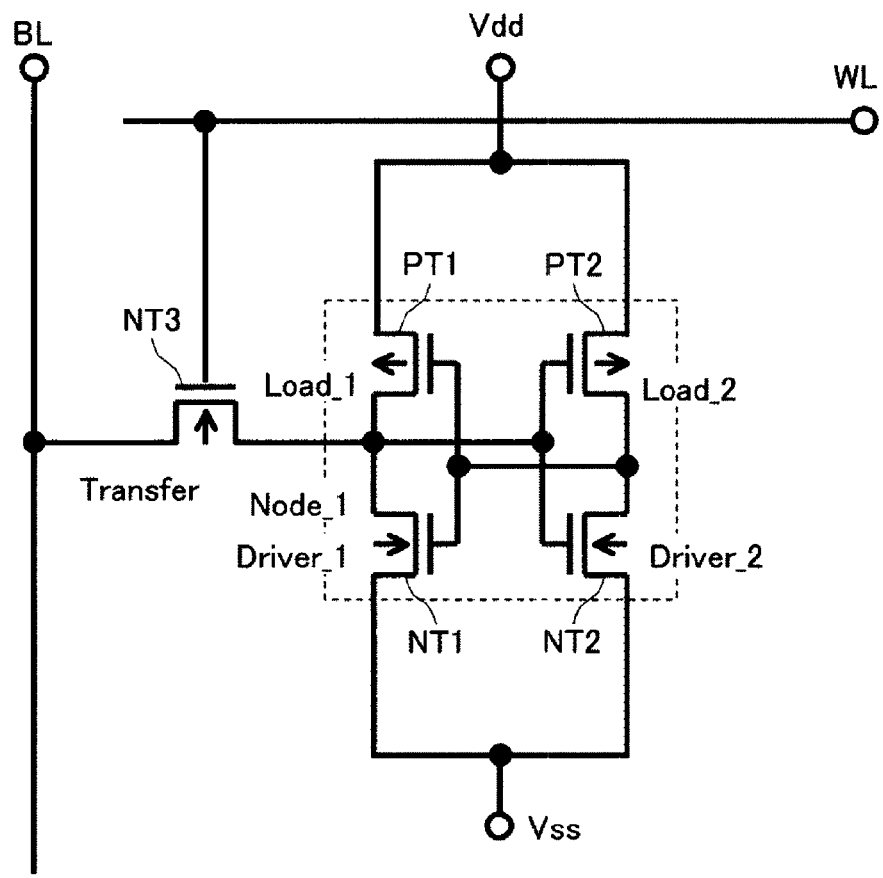
FIG. 4 is a circuit diagram showing a configuration of a 5Tr-SRAM.
Figure 5:
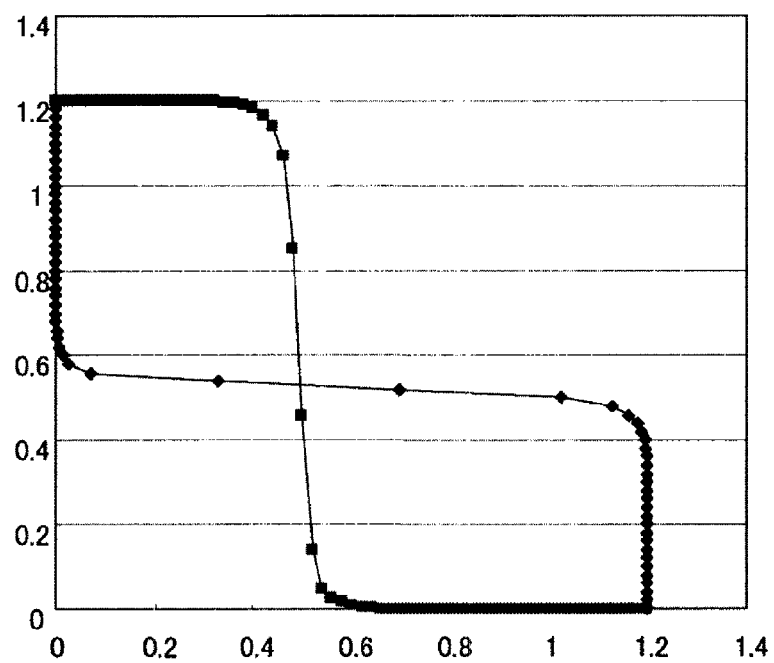
FIG. 5 is a graph showing a data holding characteristics of a flip-flop portion formed by a pair of inverters in a SRAM.
Figure 6:
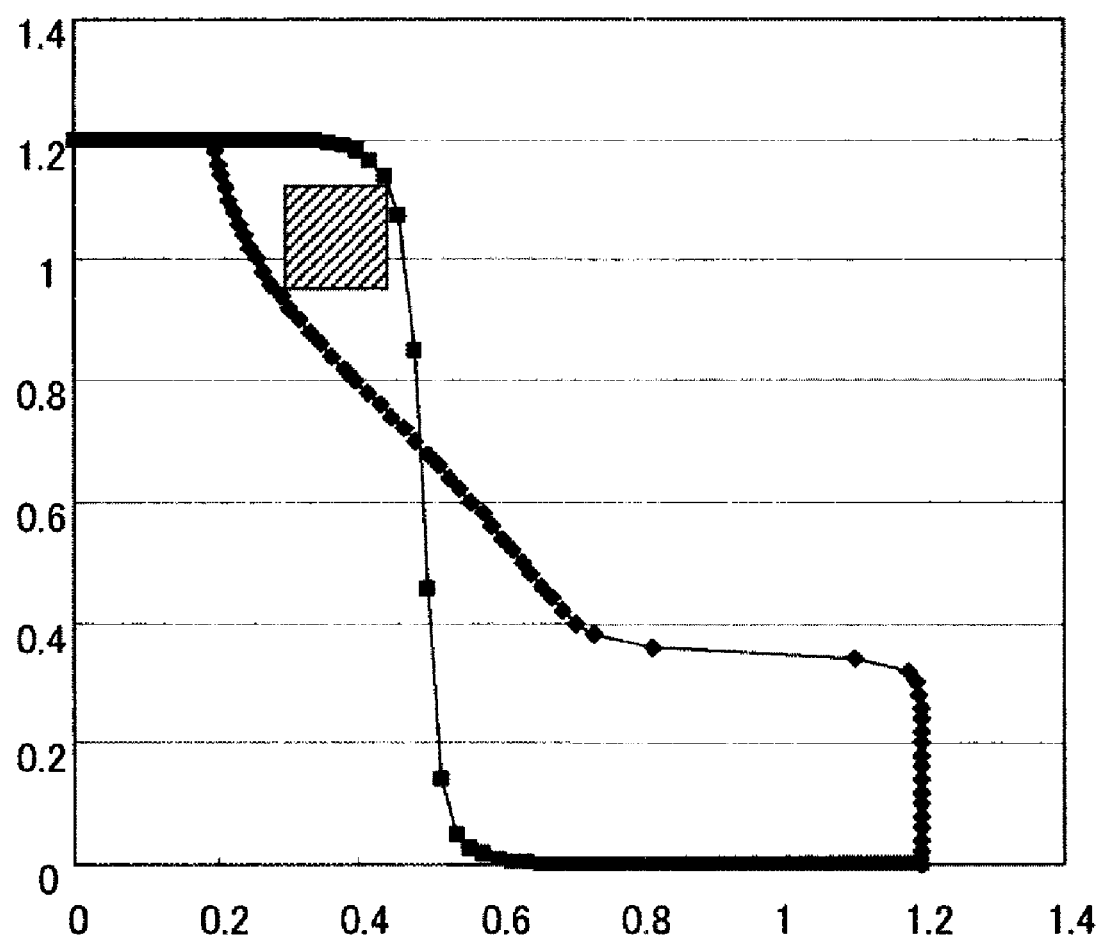
FIG. 6 is a graph showing a data holding characteristic of the 5Tr-SRAM.
Figure 7:
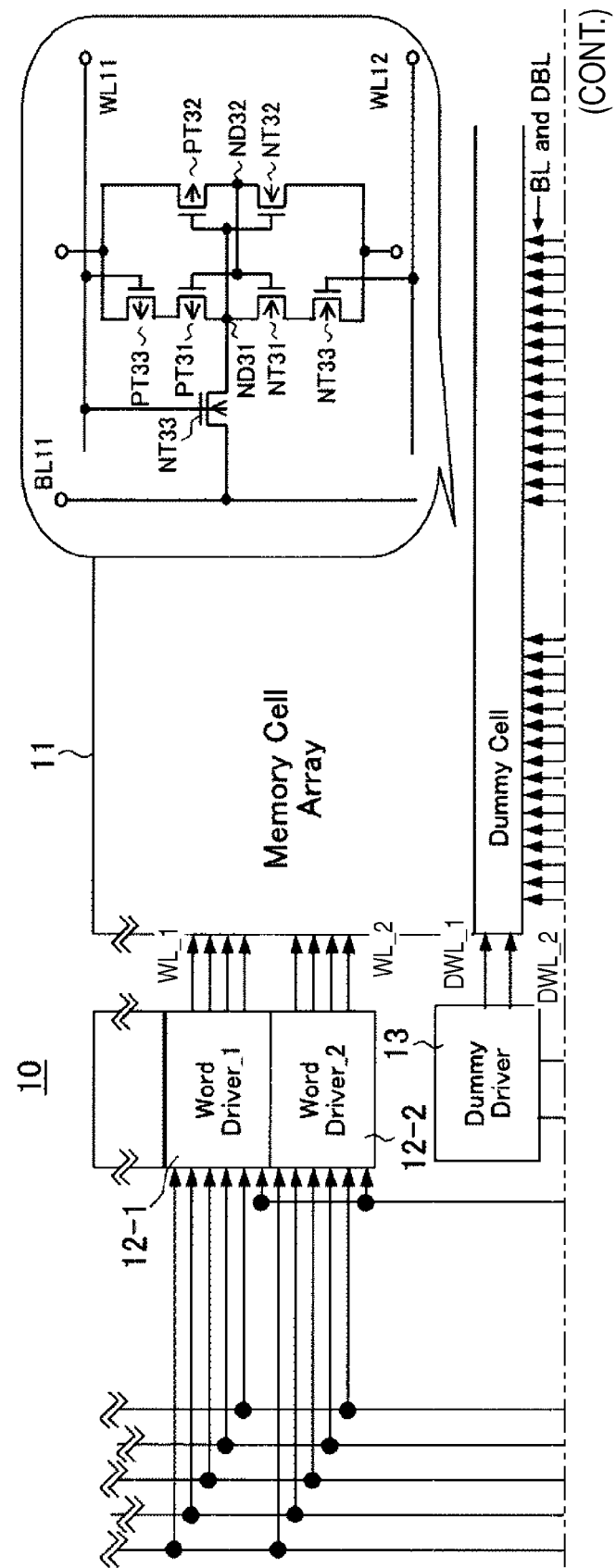
FIG. 7 is a diagram showing an example of the whole configuration of a semiconductor storage device (semiconductor integrated circuit) according to an embodiment of the invention.

FIG. 7 is a diagram showing an example of the whole configuration of a semiconductor storage device (semiconductor integrated circuit) according to an embodiment of the invention.

Figure 8:
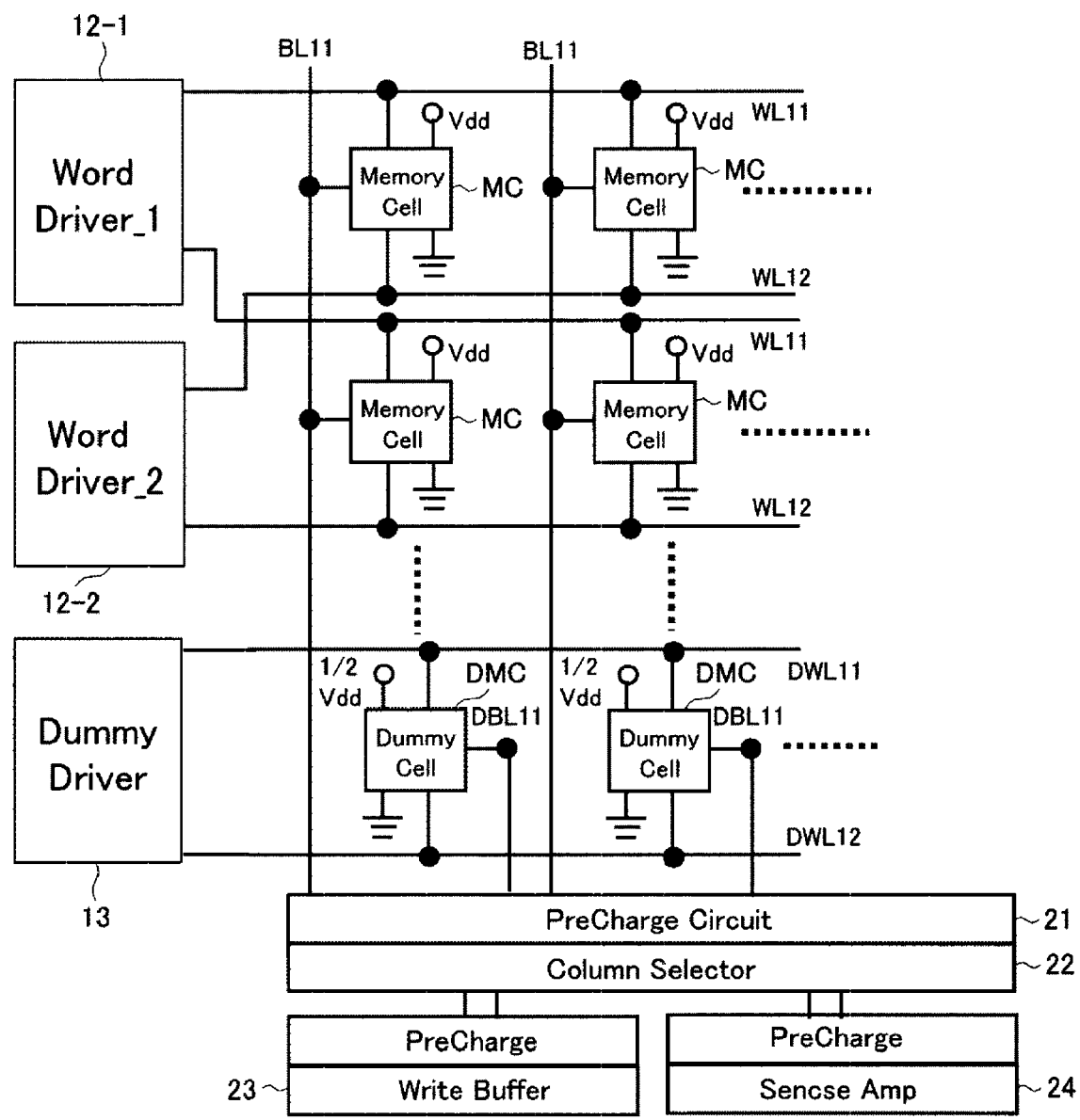
FIG. 8 is a diagram showing a configuration example of a memory cell array portion and peripheral circuits of the semiconductor storage device of FIG. 7.

FIG. 8 is a diagram showing a configuration example of a memory cell array portion and peripheral circuits of the semiconductor storage device of FIG. 7.

The semiconductor storage device 10 includes a memory cell array portion 11, word drivers 12-1, 12-2, a dummy driver 13, a row address decoder 14, a column address decoder 15, a duty free circuit 16, a self timing circuit 17, a storage circuit (D FF) 18, delay circuits (D Latches) 19, 20, a precharge circuit 21, a column selector 22, a write buffer 23, a sense amplifier 24, a delay circuit (D latch) 25 and a latch circuit 26.

The precharge circuit 21, column selector 22, the write buffer 23 and the sense amplifier 24 form a column circuit.

Data written in memory cells in the embodiment is 0-data (data of a first level) or 1-data (data of a second level).

In the memory cell array portion 11, plural pieces of (m×n) memory cells MC and n-pieces of dummy memory cells DMC are arranged in a matrix state as shown in FIG. 8.

First word lines WL 11 (-1 to -m) and second word line WL 12 (-1 to -m) are arranged at respective rows so as to correspond to row arrangement of the memory cells MC, and a first dummy word line DWL 11 and a second dummy word line DWL 12 are arranged at the row so as to correspond to row arrangement of the dummy memory cells DMC.

Further, bit lines BL 11 (-1 to -n) are arranged at respective columns so as to correspond to column arrangement of the memory cells MC. Dummy bit lines DBL 11 (-1 to -n) are arranged at respective columns so as to correspond to column arrangement of the dummy memory cells DMC.

In the embodiment, each of the memory cells and the dummy memory cells DMC is formed by a SRAM which is connected to one bit line BL11 and two word lines WL11, WL12 and which has seven MOS transistors.

Figures 9, 10:
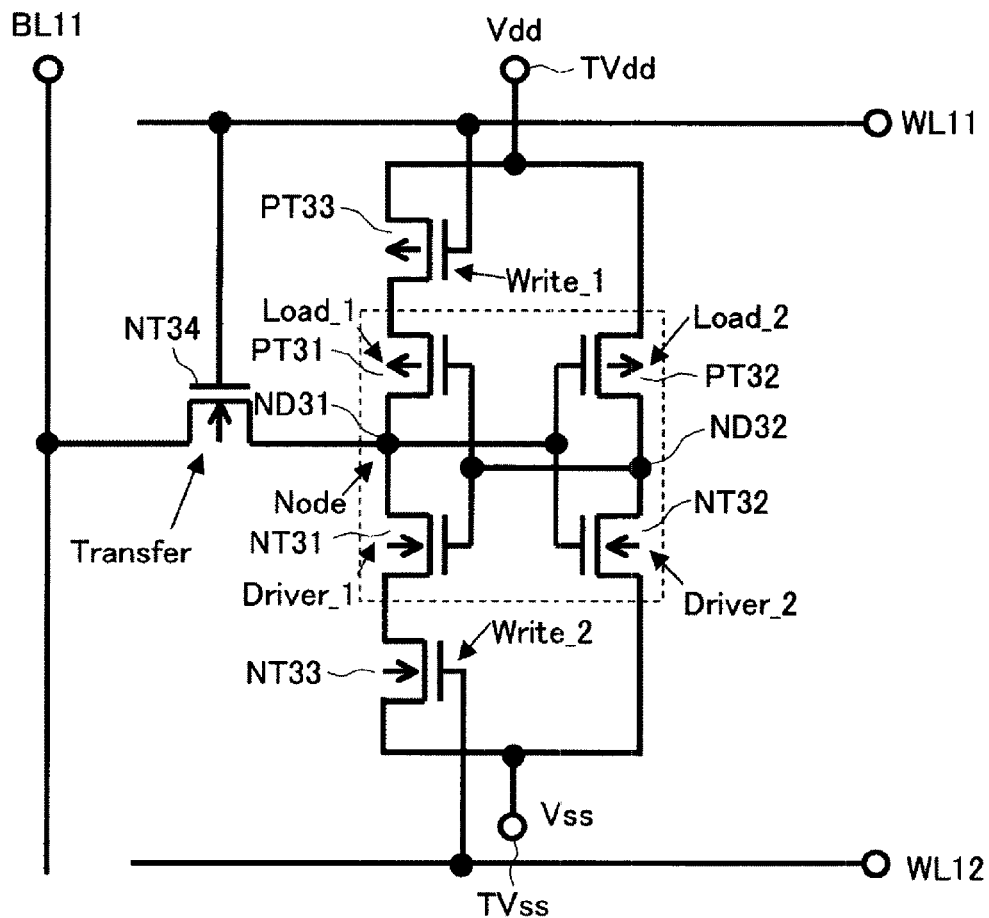
FIG. 9 is a circuit diagram showing a configuration of a SRAM cell according to an embodiment.
FIG. 10 is a table showing association of word drivers and a dummy driver according to the embodiment with respect to setting levels of first and second word lines as well as first and second dummy word lines at the time of operations of writing, reading and data holding.

FIG. 9 is a circuit diagram showing a configuration of a SRAM cell according to an embodiment.

A SRAM cell 30 includes a bit line BL11, a first word line WL11, a second word line WL12, a PMOS transistor PT31 as a first load transistor of a first conductive type (a p-type in the embodiment in the p-type (p-channel) and an n-type (n-channel)), a PMOS transistor PT32 as a p-type second load transistor, an NMOS transistor NT31 as a first driver transistor of a second conductive type (n-type in the embodiment), an NMOS transistor NT32 as an n-type second driver transistor, a PMOS transistor PT33 as a p-type first write transistor, an NMOS transistor NT33 as an n-type second write transistor and an NMOS transistor NT34 as an n-type access transistor.

A first inverter INV 31 in which one terminal (a drain in the embodiment) of the PMOS transistor PT31 as the p-type first load transistor and a drain of the NMOS transistor NT31 as the n-type first driver transistor are connected (one terminal is connected to one terminal), and a junction point therebetween forms a first node ND31, and a second inverter INV 32 in which one terminal (a drain in the embodiment) of the PMOS transistor PT32 as the p-type second load transistor and a drain of the NMOS transistor NT32 as the n-type second driver transistor are connected (one terminal is connected to one terminal), and a junction point therebetween forms a second node ND32.

A drain (one terminal) of the PMOS transistor PT33 as the first write transistor is connected to a source (the other terminal) of the PMOS transistor PT31 as the first load transistor in the first inverter INV31, and a source (the other terminal) of the PMOS transistor PT33 is connected to a terminal TVdd of the power supply voltage Vdd.

A drain (one terminal) of the NMOS transistor NT33 as the second write transistor is connected to a source (the other terminal) of the NMOS transistor NT31 as the first driver transistor in the first inverter INV31, and a source (the other terminal) of the NMOS transistor NT33 is connected to a terminal TVss of a reference potential Vss (for example, ground potential GND).

A drain (or a source, one terminal) of the NMOS transistor NT34 as the access transistor is connected to the first node ND31 in the first inverter INV31, and a source (or a drain, the other terminal) thereof is connected to the bit line BL11.

Gates (control terminals) of the PMOS transistor PT31 as the first load transistor and the NMOS transistor NT31 as the first driver transistor in the first inverter INV31 are connected to the second node ND32 of the second inverter INV32.

Gates (control terminals) of the PMOS transistor PT32 as the second load transistor and the NMOS transistor NT32 as the second driver transistor in the second inverter INV32 are connected to the first node ND31 of the first inverter INV31.

As described above, the first node ND31 and the second node ND32 which are outputs of the first inverter INV31 and the second inverter INV32 are connected to the gates of the MOS transistors which form the respective inverters, thereby forming a flip-flop.

Additionally, a gate (control terminal) of the PMOS transistor PT33 as the first write transistor and the gate of the NMOS transistor NT34 as the access transistor are connected to the first word line WL11, and a gate (control terminal) of the NMOS transistor NT33 as the second write transistor is connected to the second word line WL12.

In the embodiment, the PMOS transistor PT33 as the first write transistor and the NMOS transistor NT34 as the access transistor are ON-OFF controlled complementarily according to the level of the first word line WL11.

As described above, the SRAM cell 30 according to the embodiment is connected to one bit line and two word lines, including seven transistors.

In the seven transistors, three of them are PMOS transistors and four of them are NMOS transistors.

In other words, in the SRAM cell according to the embodiment, one bit line and two word lines are provided as well as the NMOS transistor NT33 and the PMOS transistor PT33 for write control are added to the first inverter INV31 at the access node side (the side to which the bit line is connected), which stabilizes low voltage operation.

Operations (data holding operation, 0-data write operation, 1-data write operation and data read operation) of the SPAM cell 30 will be described in detail later.

The dummy memory cell DMC also has the same configuration as the configuration of FIG. 9.

One end side of the first word line WL11 is connected to the word driver 12-1, one end side of the second word line WL12 is connected to the word driver 12-2, and the first and second dummy word lines DWL11, DWL12 are connected to the dummy driver 13.

The first word driver 12-1 receivers a row address signal, selecting a certain first word line WL11 and driving the selected first word line WL11 at a high level or a low level.

The second word driver 12-2 receives a row address signal, selecting a certain second word line WL12, driving the selected second word line WL12 at the high level or the low level.

The dummy driver 13 receives a row address signal at the time of reading data, selecting the first dummy word line DWL11 and the second dummy word line DWL12, driving the selected first dummy word line DWL11 and the second dummy word line DWL 12 at the high level and the low level.

FIG. 10 is a table showing association of the word drivers and the dummy driver according to the embodiment with respect to setting levels of the first and second word lines as well as the first and second dummy word lines at the operations of writing, reading and data holding.

To a control block CTBLK including the row address decoder 14, the column address decoder 15, the duty free circuit 16, the self timing circuit 17, the data storage circuit 18 and the delay circuits (D Latches) 19, 20 of the semiconductor storage device 10, a column select signal CL which is active at the high level and a write enable signal WE which is active at the low level are inputted.

Therefore, at the time of write operation, the column select signal CL is inputted at the high level and the write enable signal WE is inputted at the low level.

At the time of read operation, the column select signal CL is inputted at the high level and the write enable signal WE is inputted at the high level.

At the time of data holding operation, the column select signal CL is inputted at the low level.

At the time of write operation, both the first word line WL11 selected by the first word driver 12-1 and the second word line WL12 selected by the second word driver 12-2 are set at the high level.

At the time of write operation, the dummy driver 13 does not drive the dummy word line.

At the time of read operation, the first word line WL11 selected by the first word driver 12-1 is set at the high level and the second word line WL12 selected by the second word driver 12-2 is set at the low level.

At this time, the first dummy word line DWL11 is set at the high level and the second dummy word line DWL12 is set at the low level by the dummy driver 13.

At the time of data holding operation, the first word line WL11 selected by the first word driver 12-1 is set at the low level and the second word line WL12 selected by the second word driver 12-2 is set at the high level.

At the time of data holding operation, the dummy driver 13 does not drive the dummy word line.

The row address decoder 14 performs decoding by inputting a row address, outputting the signal to the data storage circuit 18 and the delay circuit 19.

The column address decoder 15 performs decoding by inputting a column address, outputting the address to the delay circuit 20.

The duty free circuit 16 generates a clock signal for input data latch LCK and an internal clock signal INCK from an external clock signal CK and a core enable signal CE without affected by a duty ratio (ratio of time when the signal becomes high with respect to one cycle), supplying the signals to the self timing circuit 17, the data storage circuit 18, the delay circuits 19, 20, the first word driver 12-1 and the second word driver 12-2.

The self timing circuit 17 generates a write signal WRE, a precharge signal PRE and a sense amplifier activation signal SAE from the internal clock signal INCK, outputting the signals to the column selector 22, the write buffer 23, the sense amplifier 24, the delay circuit 25 and the latch circuit 26 if necessary.

Figure 11:
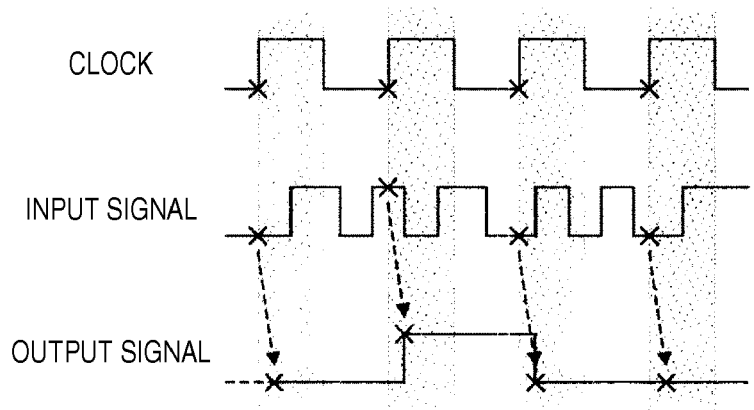
FIG. 11 is a timing chart of a data storage circuit according to the embodiment.

The data storage circuit 18 includes a D-type flip-flop (D flip-flop), which outputs an input signal, synchronizing with the rising edge of the clock signal as shown in FIG. 11. In the data storage circuit 18, a value of a previous output signal is held until the rising edge of a next clock signal is inputted as shown in FIG. 11.

Figure 12:
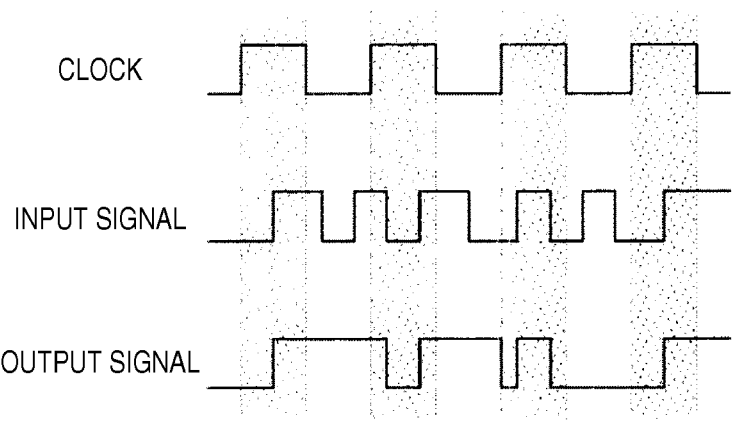
FIG. 12 is a timing chart of a delay circuit according to the embodiment.

The delay circuits (Delay latches) 19, 20 output an input signal as it is only when the clock signal is "high" as shown in FIG. 12. In the delay circuits 19, 20, a value of a previous output signal is held when the clock signal is "low" as shown in FIG. 12.

The precharge circuit 21 maintains potential (level) of the bit line BL11 selected by the column selector 22 "high".

While the precharge signal PRE is "high", the potential of the bit line BL11 is "high", and respective bit cells are precharged.

The column selector 22 receives the column select signal CL, selecting a certain bit line BL11 and outputting a bit line signal (BL).

The write buffer 23 fixes one bit line BL11 to "high" and fixes the other bit line, namely, the dummy bit line DBL11 to "low" at the time of write operation.

The sense amplifier 24 receives the sense amplifier activation signal SAE, amplifying the potential difference between two bit lines.

Figure 13:
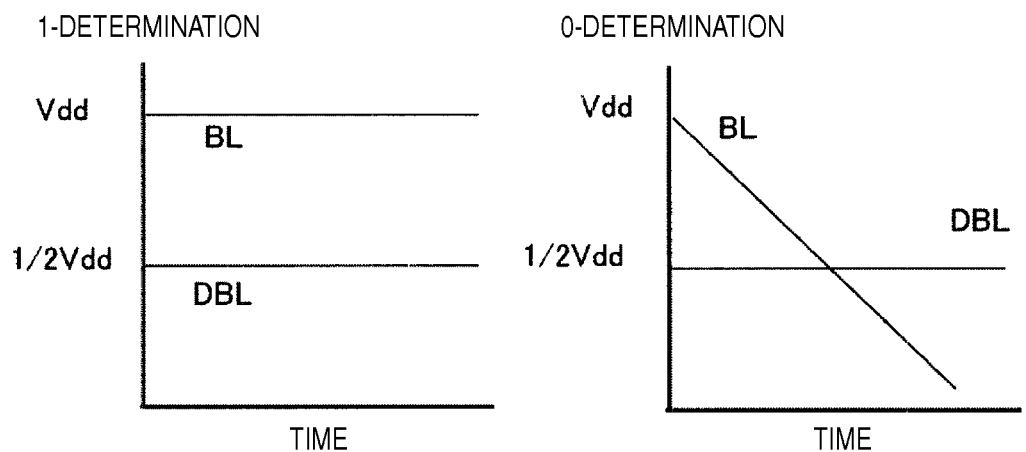
FIG. 13 shows graphs for explaining the operation concept of a sense amplifier.

FIG. 13 shows graphs for explaining the operation concept of the sense amplifier.

As shown in FIG. 13, the sense amplifier 24 operates the dummy memory cell DMC at ½ Vdd. Then, the sense amplifier 24 determines whether data is "0" or "1" by comparing voltages of the bit line BL11 and the dummy bit line DBL11.

Figure 14C:
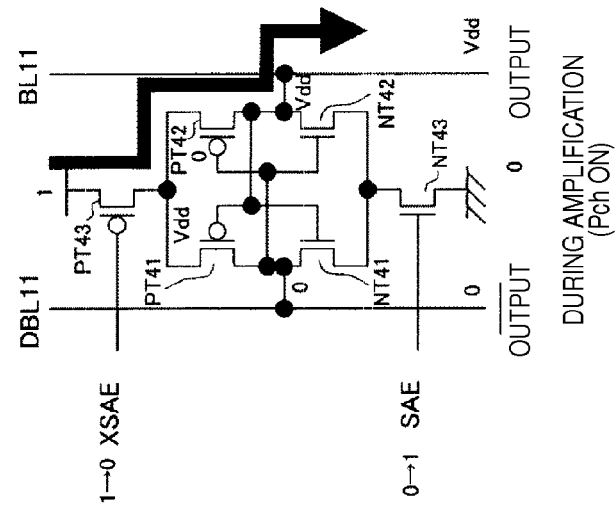
FIG. 14A to FIG. 14C are views showing a first configuration example and operations of the sense amplifier.
Figure 14B:
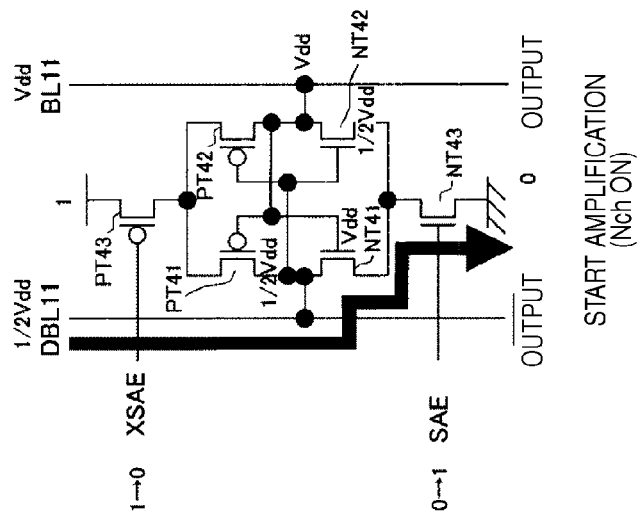
Figure 14A:
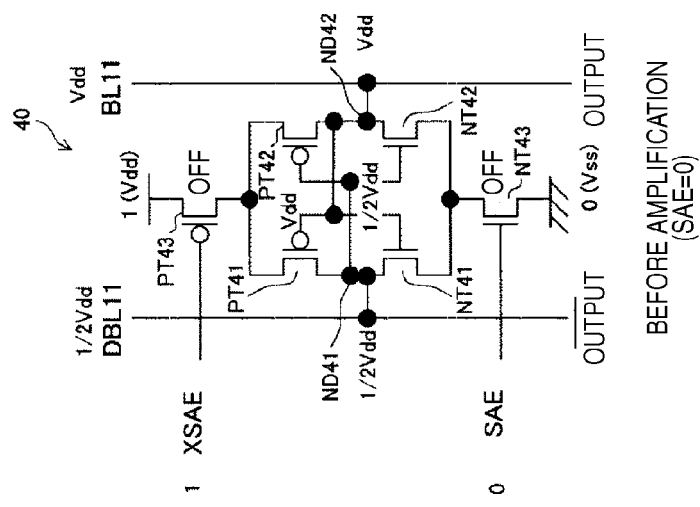

FIG. 14A to FIG. 14C are views showing a first configuration example and operations of the sense amplifier.

A sense amplifier 40 shown in FIG. 14A to FIG. 14C includes PMOS transistors PT41 to PT43 and NMOS transistors NT41 to NT43.

Sources of the PMOS transistor PT41 and the PT42 are connected to a drain of the PMOS transistor PT43, and a source of the PMOS transistor PT43 is connected to a line of the power supply voltage Vdd.

A drain of the PMOS transistor PT41 is connected to a drain of the NMOS transistor NT41, and a junction point therebetween forms a node ND41, further, the node ND41 is connected to the dummy bit line DBL11.

A drain of the PMOS transistor PT42 is connected to a drain of the NMOS transfer NT42, and a junction point therebetween forms a node ND42, further, the node ND42 is connected to the bit line BL11.

Gates of the PMOS transistor PT41 and the NMOS transistor NT41 are connected to the node ND42, and gates of the PMOS transistor 42 and the NMOS transistor NT42 are connected to the node ND41.

Sources of the NMOS transistor NT41 and the NMOS transistor NT42 are connected to a drain of the NMOS transistor NT43, and a source of the NMOS transistor NT43 is connected to the line of the reference potential Vss.

A gate of the NMOS transistor NT43 is connected to a supply line of the sense amplifier activation signal SAE, and a gate of the PMOS transistor PT43 is connected to a supply line of an inverted signal XSAE of the sense amplifier activation signal SAE.

Now, assume that the bit line BL11 is set at Vdd and the dummy bit line DBL 11 is set at ½ Vdd as shown in FIG. 14A.

When amplification by the sense amplifier 24 is started, the sense amplifier activation signal SAE becomes the high level (1) and the inverted signal XSAE becomes the low level (0).

Focusing attention on the n-channel MOS transistor, when the sense amplifier activation signal SAE rises to the high level (1), the NMOS transistor NT41 turns on before the NMOS transistor NT42 in relation to the voltage, and the potential of the dummy bit line DBL11 becomes 0V from the ½ Vdd.

Next, focusing attention on the p-channel MOS transistor, the PMOS transistor PT42 turns on before the PMOS transistor PT41, and the potential of the bit line BL11 becomes Vdd from Vdd. At this time, the PMOS transistor PT41 is in an OFF state in relation to the voltage as shown in FIG. 14C.

As a result, data of the potential Vdd in the bit line BL11 and the potential ½ Vdd in the dummy bit line DBL11 is amplified to the output=Vdd and the output=0V by the sense amplifier 40.

Figure 15:
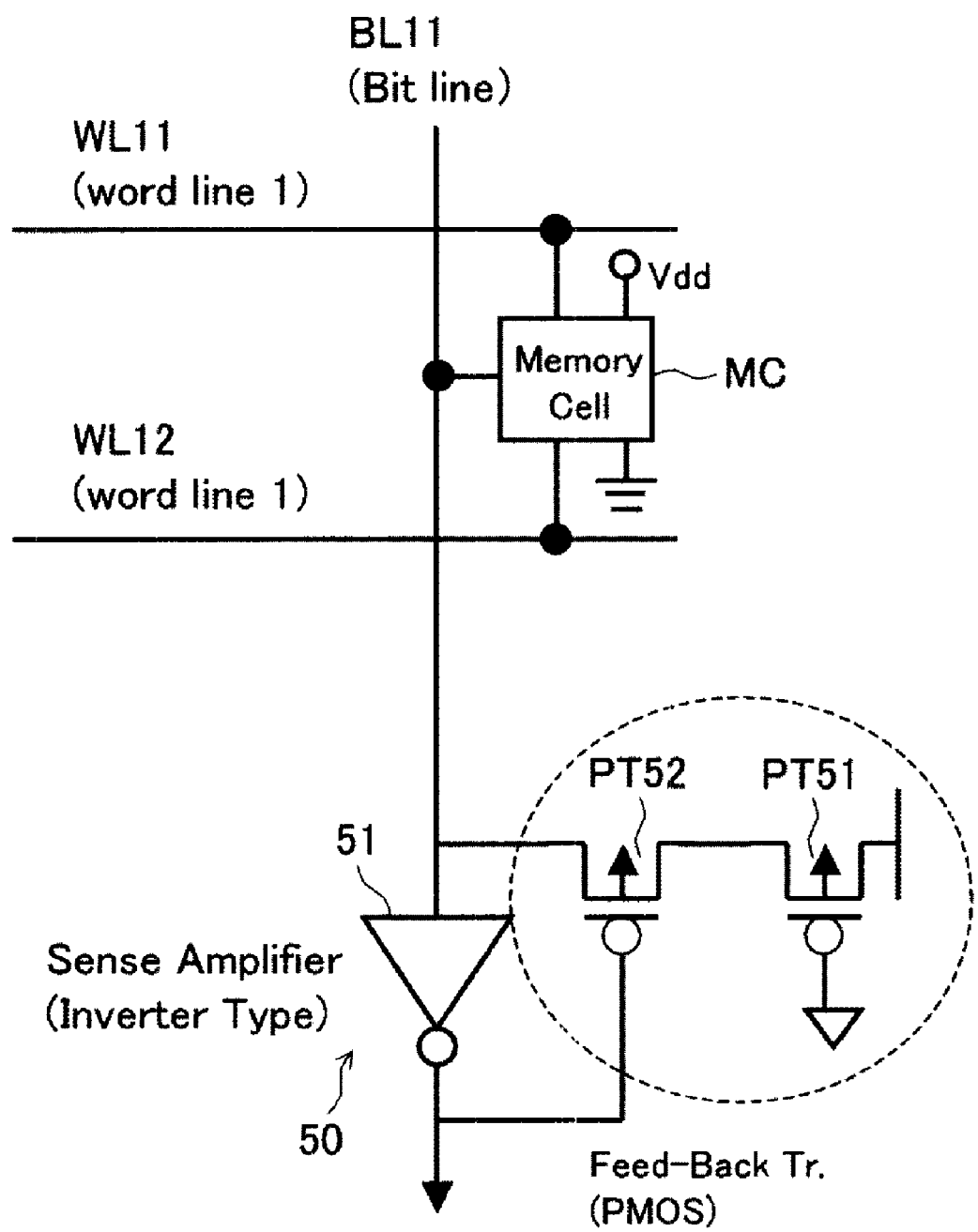
FIG. 15 is a view showing a second configuration example and operations of the sense amplifier.

FIG. 15 is a view showing a second configuration example and operations of the sense amplifier.

A sense amplifier 50 of FIG. 15 is configured as an inverter-type sense amplifier, including an inverter 51 and feedback transistors PMOS transistor PT51, PT 52.

In the example of FIG. 15, the bit line (bit cell) is charged to the power supply voltage Vdd as an initialized state of the read operation.

In the state that the bit line BL11 is charged at the power supply voltage Vdd, the feedback transistors PT51, PT52 are maintained in an ON state, and the voltage Vdd is supplied to the bit line BL11.

When the bit line BL11 is discharged (when the sense amplifier is inverted), the feedback transistor PT52 is turned off, and the voltage Vdd to the bit line BL11 is stopped.

In the case that the bit cell is 1 (Vdd), the sense amplifier 50 constantly outputs 0V (low-level signal), while the bit line BL11 is charged to Vdd.

In the case that the bit cell is 0 (0V), the bit line BL11 is discharged and comes close to 0V gradually, and when the inverter output of the sense amplifier 50 is inverted at a certain point, 1 (Vdd) is outputted.

When the output of the sense amplifier is received by the inverter as described above, data 0 or 1 which is the same as data of the bit cell can be outputted.

The determination of 0 or 1 by the comparison with respect to the dummy cell is not necessary in the sense amplifier system.

The above is the explanation of the whole configuration and functions of the semiconductor storage device.

Next, operations of the SRAM cell according to the embodiment will be explained.

Figure 16A:
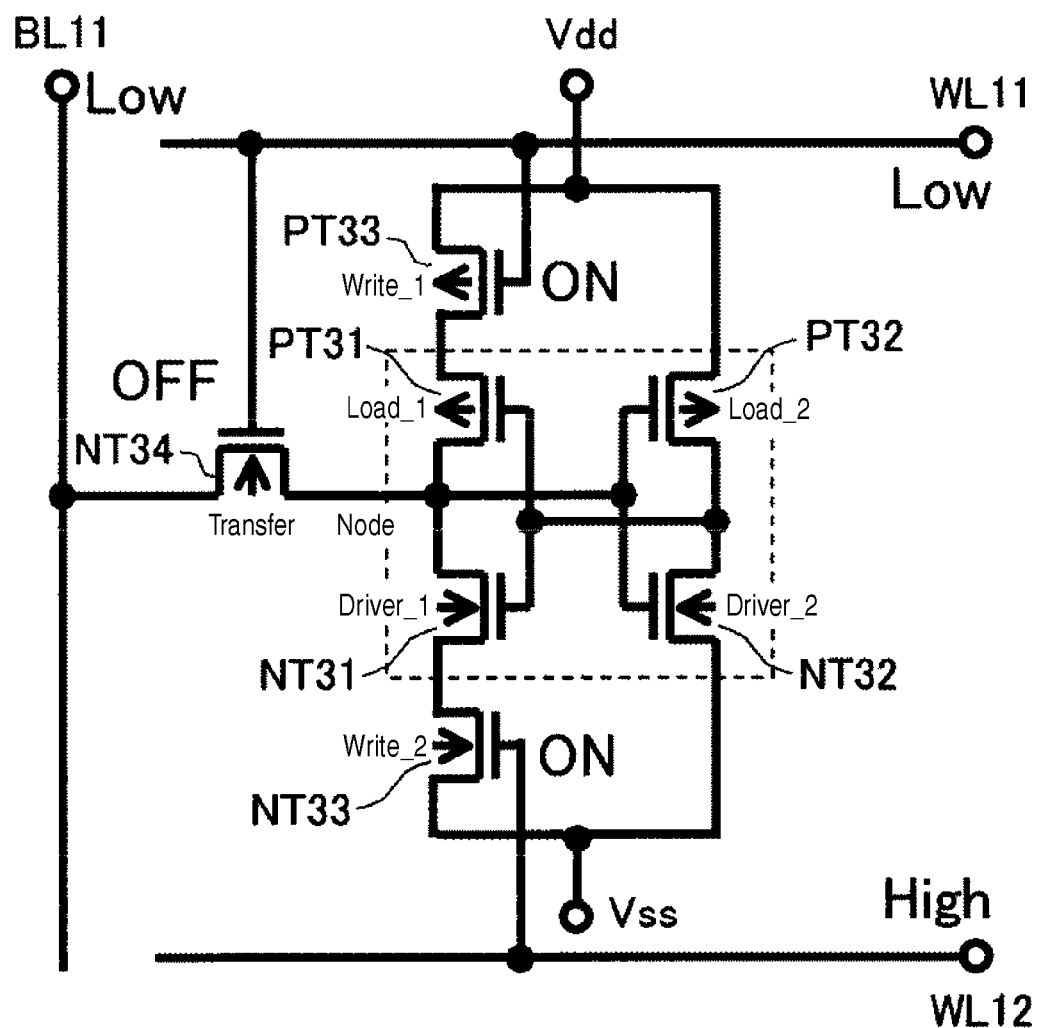
FIG. 16A and FIG. 16B are views for explaining data holding operation of a SRAM cell according to the embodiment.
Figure 16B:
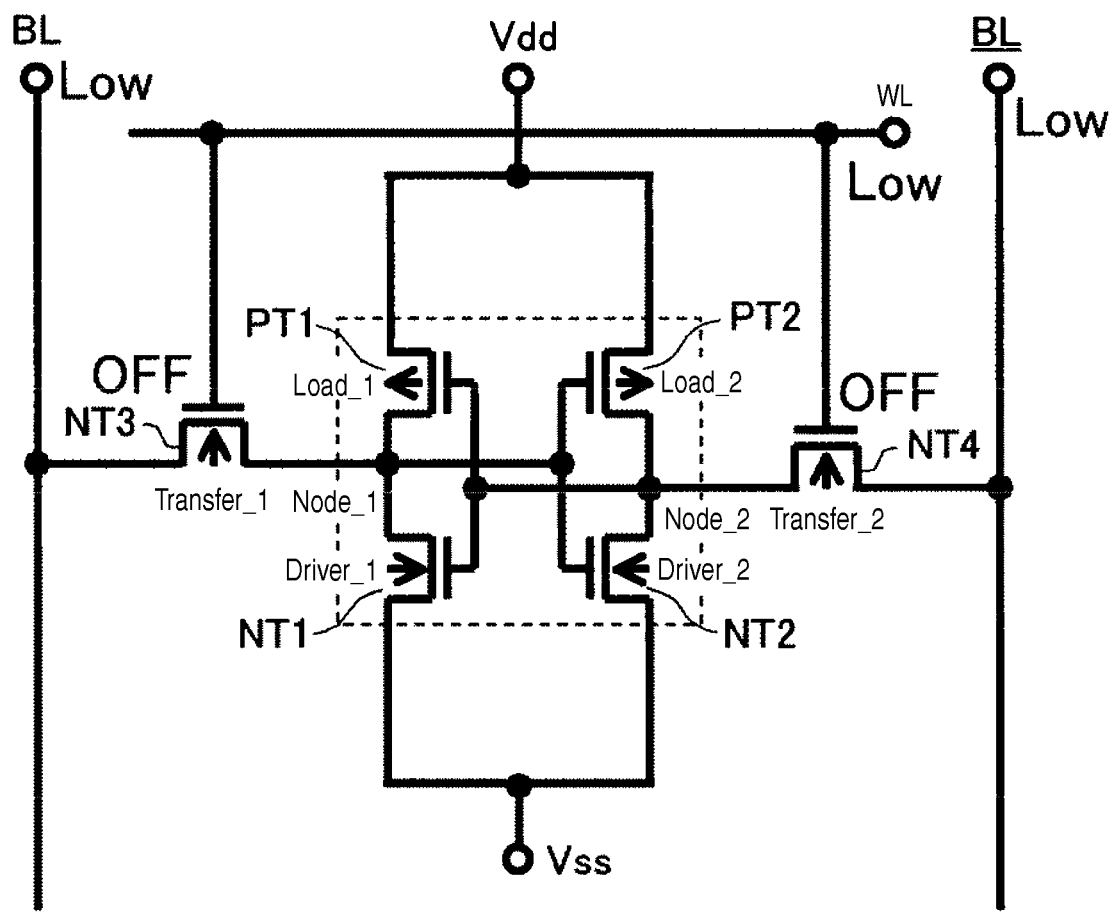

FIG. 16A and FIG. 16B are views for explaining data holding operation of the SRAM cell according to the embodiment.

In FIG. 16A and FIG. 16B, data holding states of the memory cell according to the embodiment (present invention) and a 6Tr-SRAM cell are shown by comparing them with each other.

In the data holding operation, the potential of the bit line BL11 may be at the high level (Vdd) or at the low level (0V).

In this case, the first word line WL11 is set at the low level and the second word line WL12 is set at the high level.

According to the above, the PMOS transistor PT33 as the first write transistor is maintained in an ON state and the NMOS transistor NT34 as the access transistor is maintained in an OFF state by the first word line WL11.

Also, the NMOS transistor NT33 as the second write transistor is maintained in an ON state by the second word line WL12.

At this time, both the first inverter INV31 and the second inverter INV32 are connected to Vdd and Vss, which is the same operation as the 6Tr-SRAM cell.

Figure 17A:
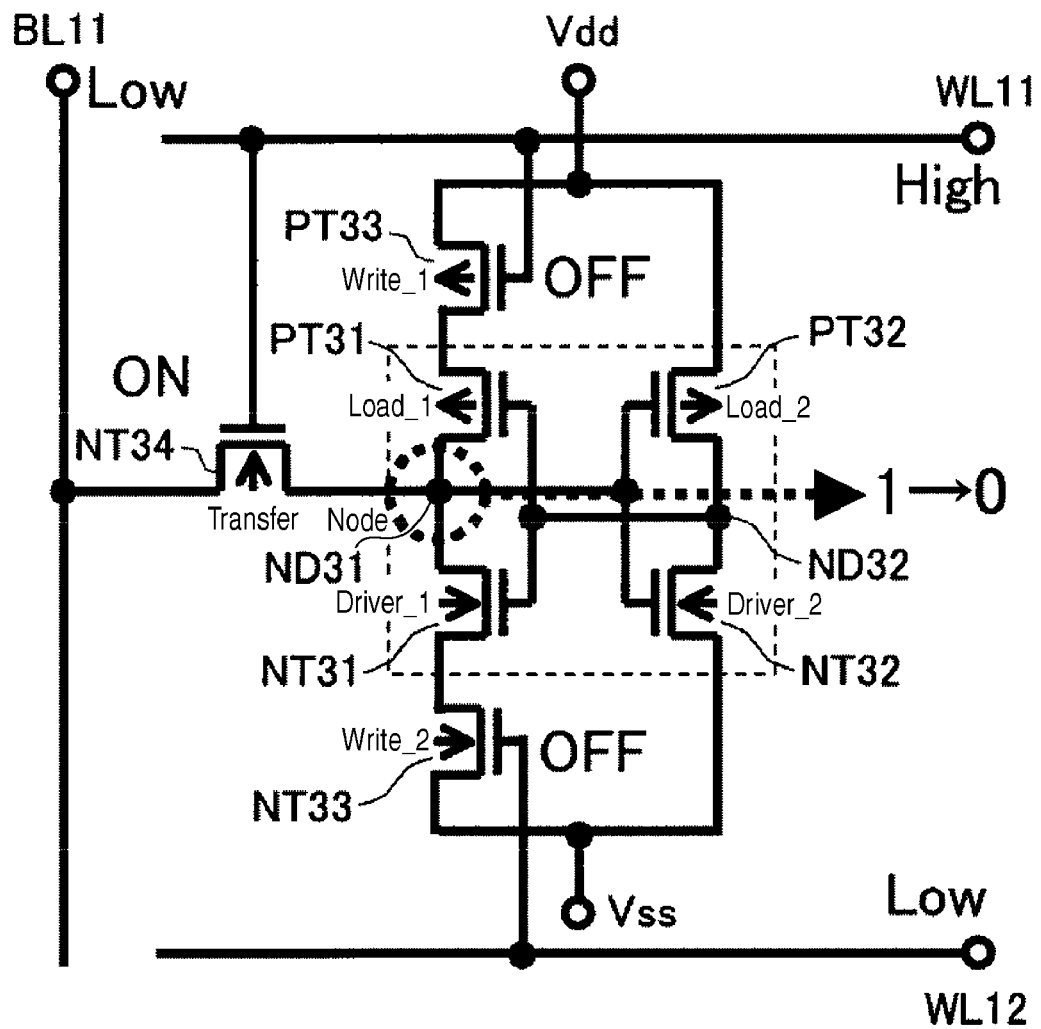
FIG. 17A and FIG. 17B are views for explaining data write operation (1→0) of the SRAM cell according to the embodiment.
Figure 17B:
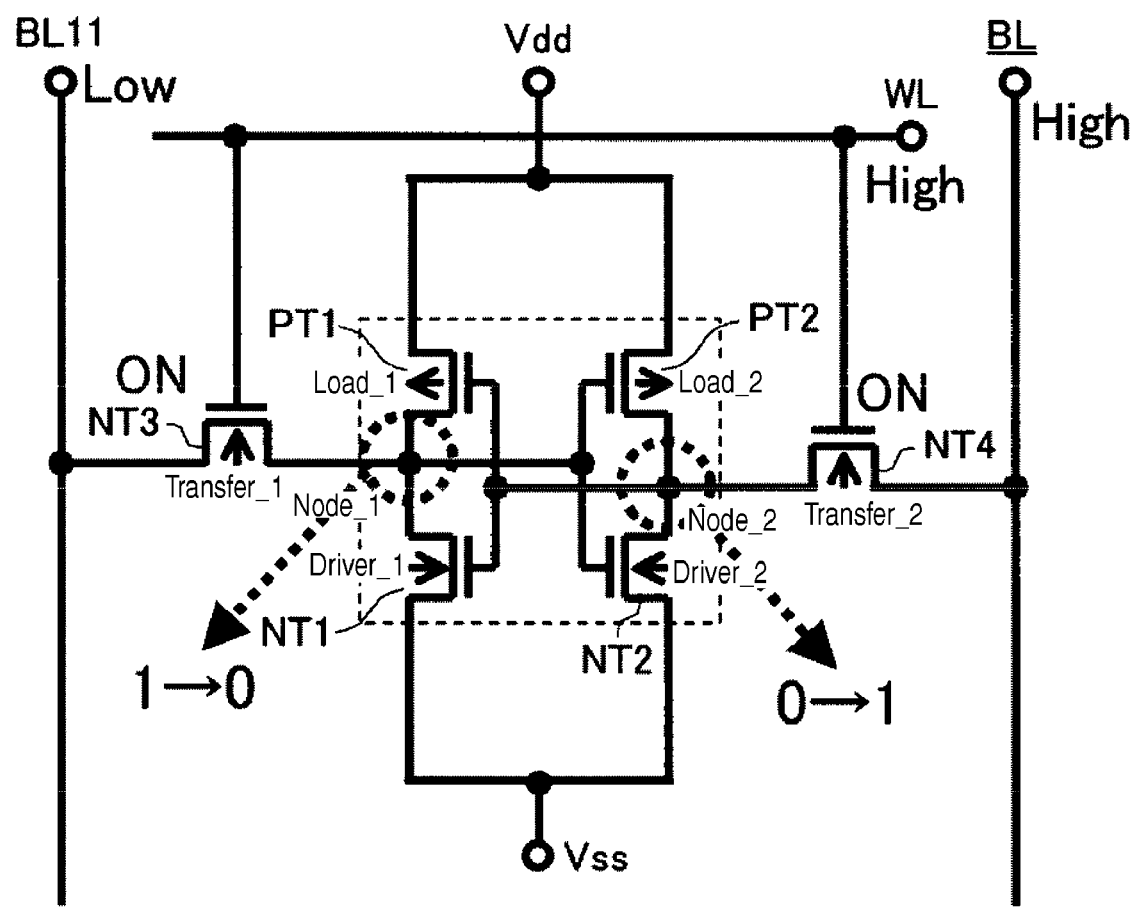

FIG. 17A and FIG. 17B are views for explaining data write operation (1→0) of the SRAM cell according to the embodiment.

In FIG. 17A and FIG. 17B, data holding states of the memory cell according to the embodiment (present invention) and the 6Tr-SRAM cell are shown by comparing them with each other.

In this case, the bit line BL11 is set at the low level (first level).

The first word line WL11 is set at the high level and the second word line WL12 is set at the low level.

According to the above, the PMOS transistor PT33 as the first write transistor is maintained in an OFF state and the NMOS transistor NT34 as the access transistor is maintained in an ON state by the first word line WL11.

Also, the NMOS transistor NT33 as the second write transistor is maintained in an OFF state by the second word line WL12.

The PMOS transistor PT33 as the first write transistor is in the OFF state, the power supply voltage is not supplied to the first node ND31, which stabilizes data writing (inversion of 1→0) as compared with the 6Tr-SRAM.

Figure 18A:
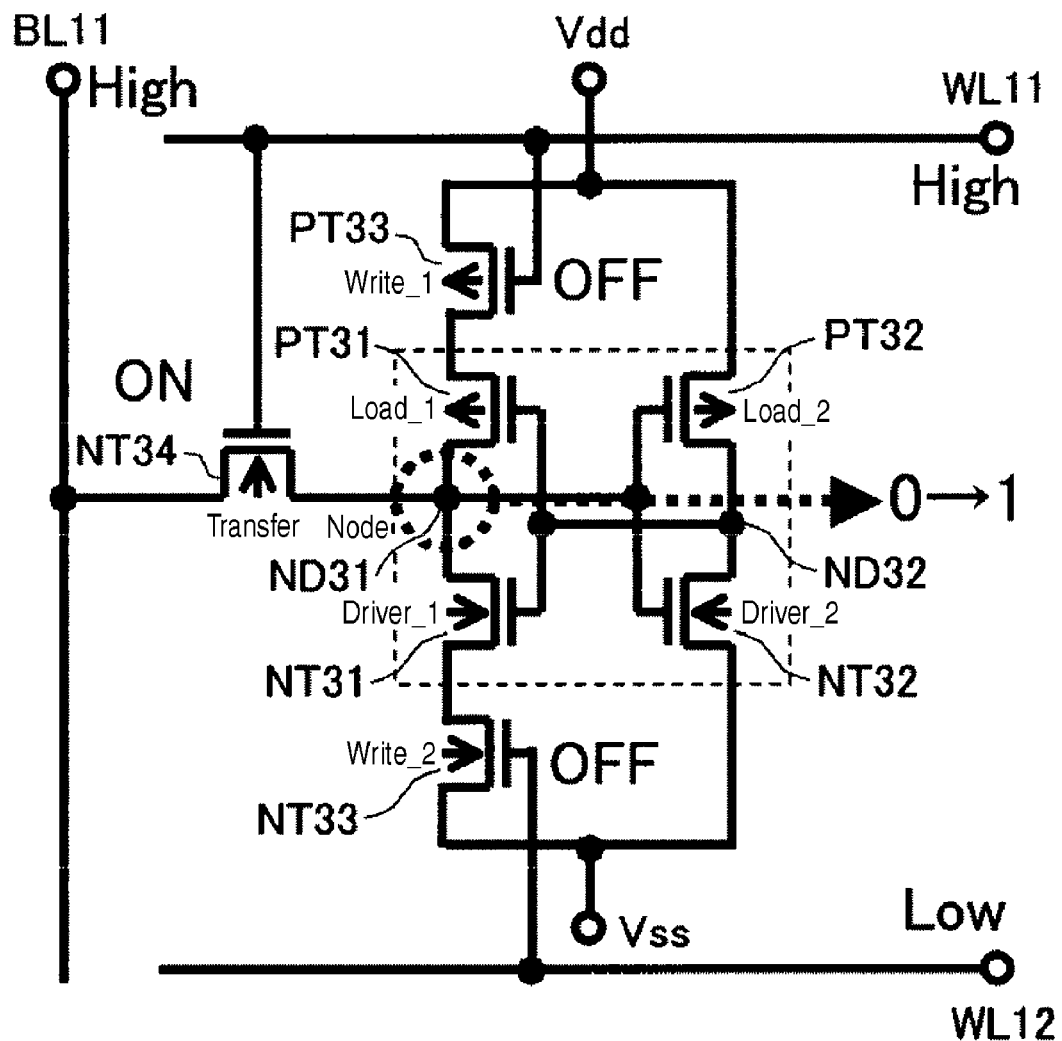

FIG. 18A and FIG. 18B are views for explaining data write operation (0→1) of the SRAM cell according to the embodiment.

In FIG. 18A and FIG. 18B, data holding states of the memory cell according to the embodiment (present invention) and the 6Tr-SRAM cell are shown by comparing them with each other.

In this case, the bit line BL11 is set at the high level (second level).

The first word line WL11 is set at the high level and the second word line WL12 is set at the low level.

According to the above, the PMOS transistor PT33 as the first write transistor is maintained in an OFF state and the NMOS transistor NT34 as the access transistor is maintained in an ON state by the first word line WL11.

Also, the NMOS transistor NT33 as the second write transistor is maintained in an OFF state by the second word line WL12.

The NMOS transistor NT33 is in the OFF state, therefore, the first node ND31 is cut from the reference potential Vss (GND), as a result, data writing (inversion of 0→1) is stabilized as compared with the 6Tr-SRAM of the related art.

Figure 19A:
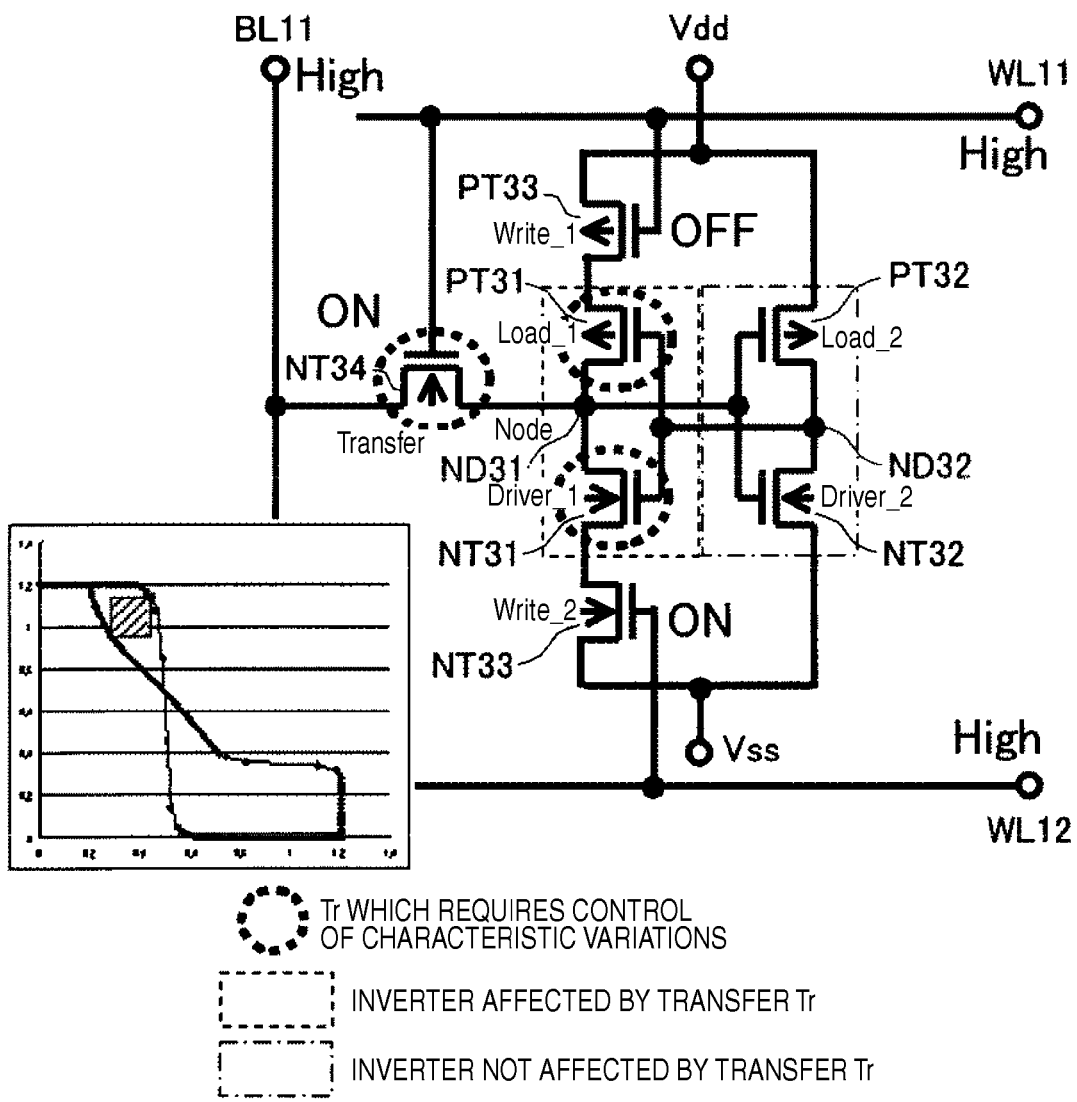
FIG. 19A and FIG. 19B are views for explaining data read operation of the SRAM cell according to the embodiment.
Figure 19B:
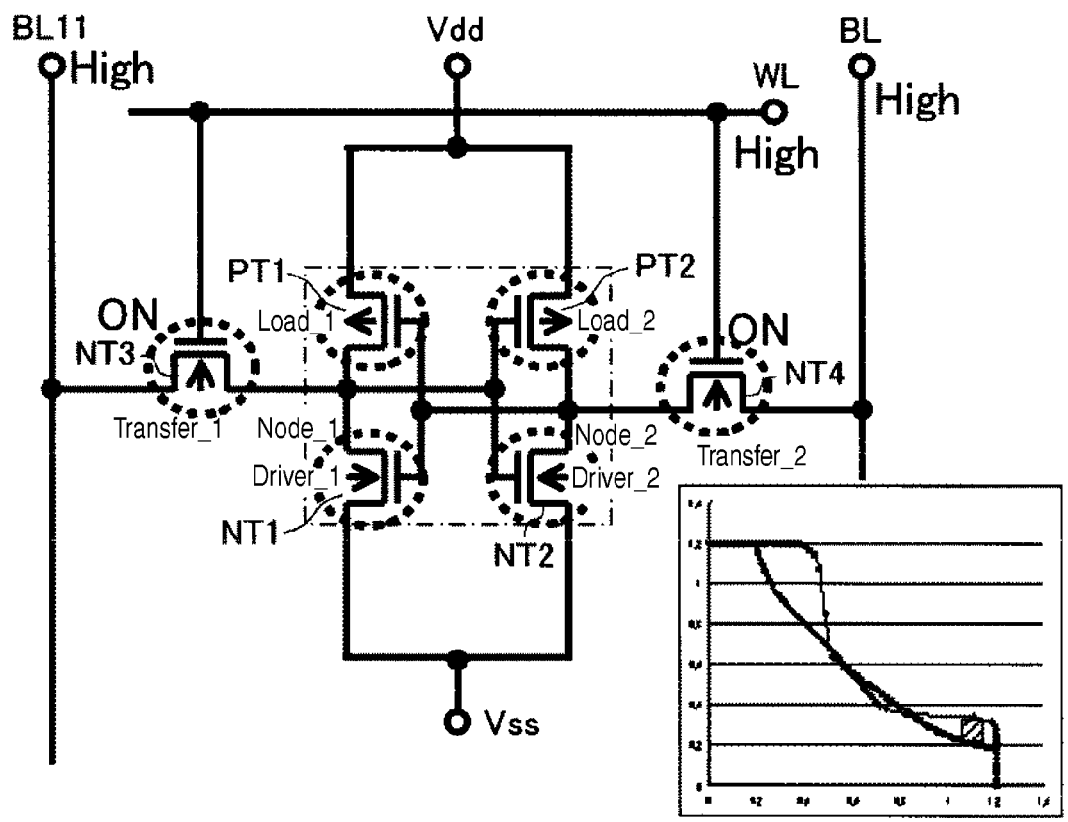
Figure 19B:
Figure 19B:
Figure 19B:
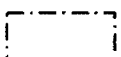

FIG. 19A and FIG. 19B are views for explaining data read operation of the SRAM cell according to the embodiment.

In FIG. 19A and FIG. 19B, data holding states of the memory cell according to the embodiment (present invention) and the 6Tr-SRAM cell are shown by comparing them with each other.

In this case, the bit line BL11 is precharged at the high level (second level).

Also, the first word line WL11 is set at the high level and the second word line WL11 is set at the high level.

The PMOS transistor PT33 as the first write transistor is maintained in an OFF state and the NMOS transistor NT34 as the access transistor is maintained in an ON state by the first word line WL11.

Also, the NMOS transistor NT33 as the second write transistor is maintained in an ON state by the second word line WL12.

Since the memory cell according to the embodiment has one bit line, the inverter to which the NMOS transistor NT34 as the access transistor is connected (affected by the access) is only the first inverter INV31, therefore, it is possible to secure the SNM wider than the SNM of the 6Tr-SRAM.

Additionally, concerning characteristic variations of transistors, the number of transistors affecting the SNM is reduced from 6 to 3, which is more advantageous than the 6Tr-SRAM.

The cell layout of the memory cell of FIG. 9 will be shown in FIG. 20 to FIG. 23.

Figure 20:
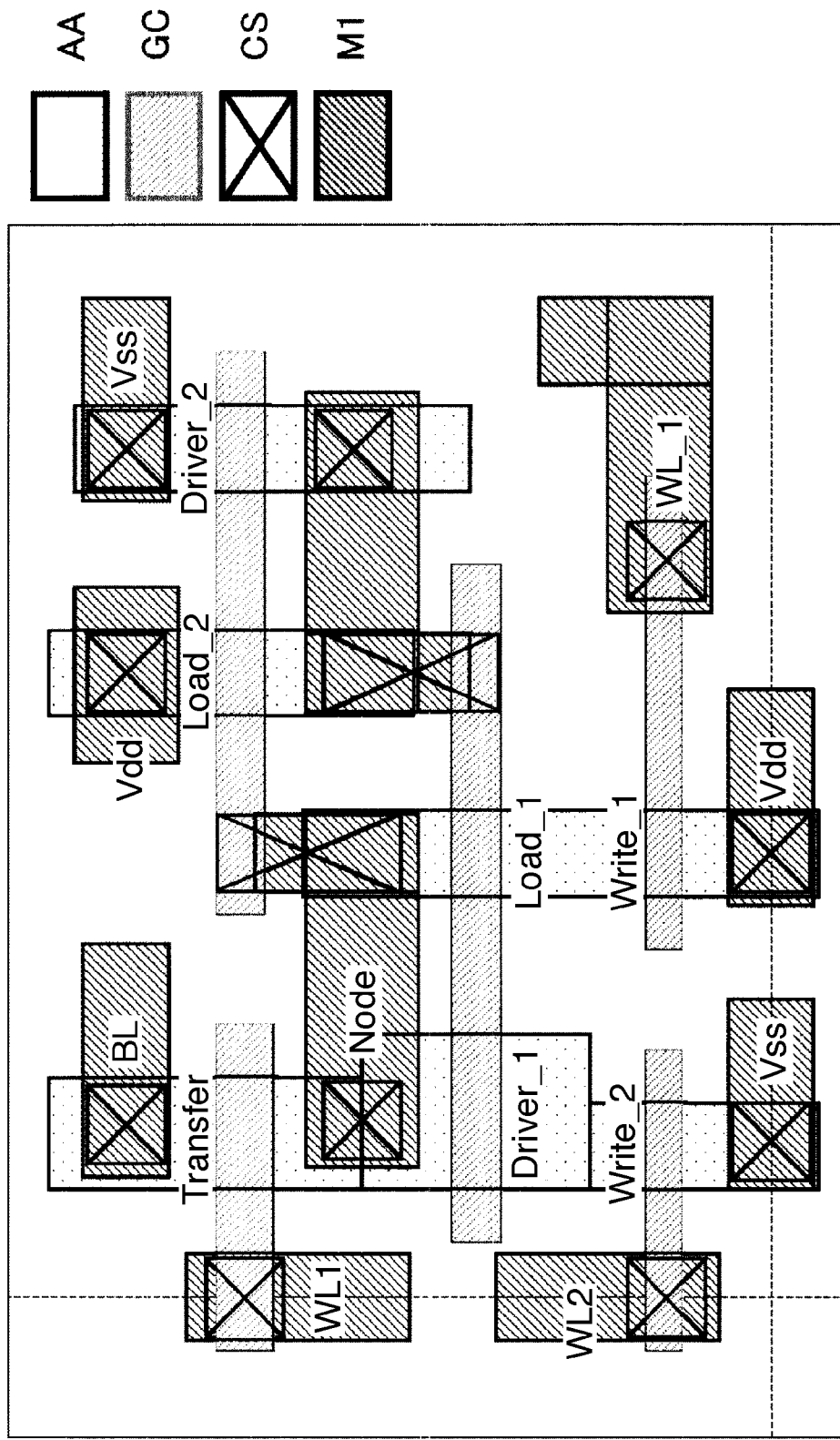
FIG. 20 shows a layout example of an active, a gate, a first-contact and a first-metal which realizes the circuit of FIG. 9.

FIG. 20 shows a layout example of an active, a gate, a first-contact and a first-metal which realizes the circuit of FIG. 9.

Figure 21:
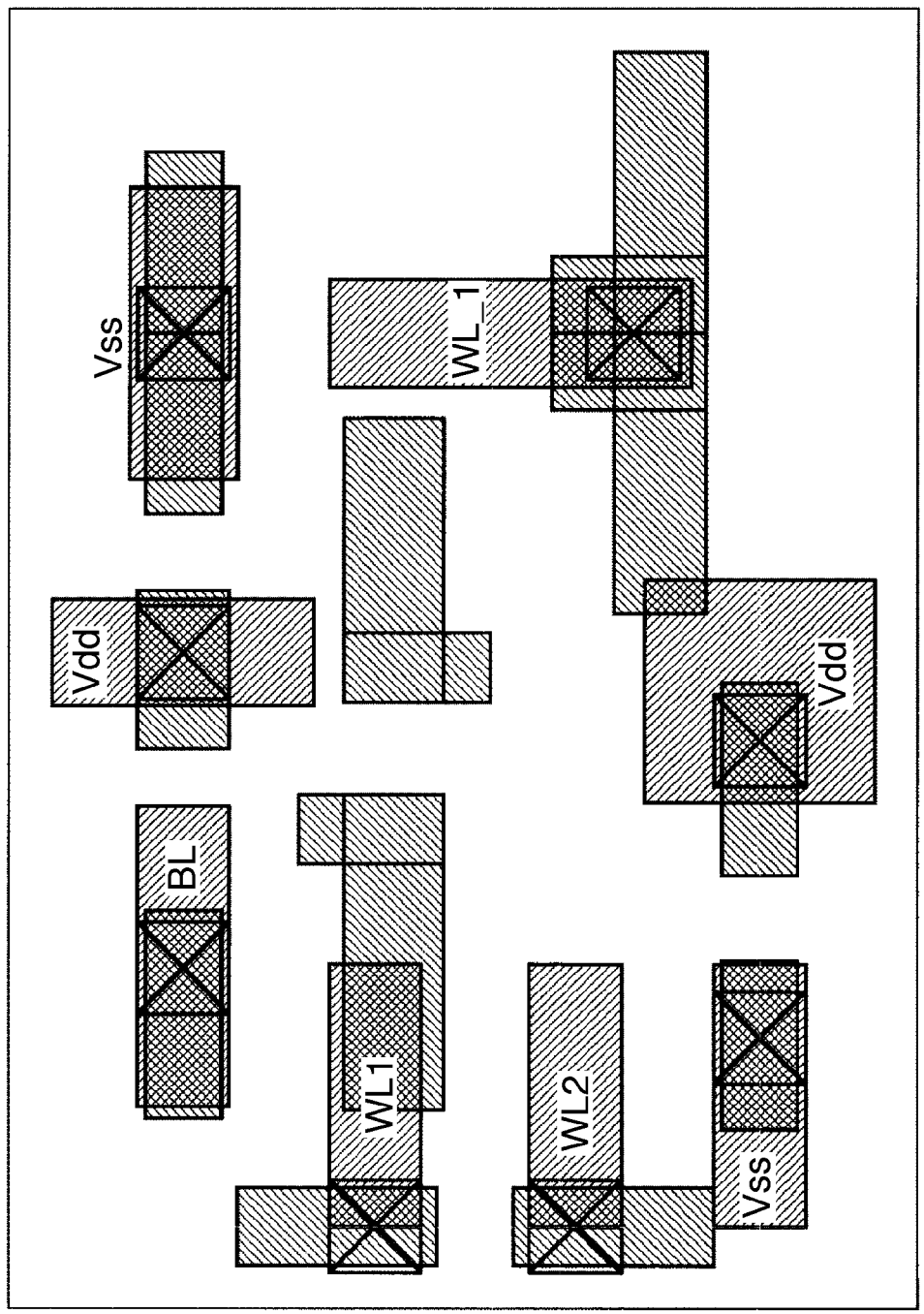
FIG. 21 shows a layout example of the first-metal, a second-contact and a second metal which realizes the circuit of FIG. 9.

FIG. 21 shows a layout example of the first-metal, a second-contact and a second metal which realizes the circuit of FIG. 9.

Figure 22:
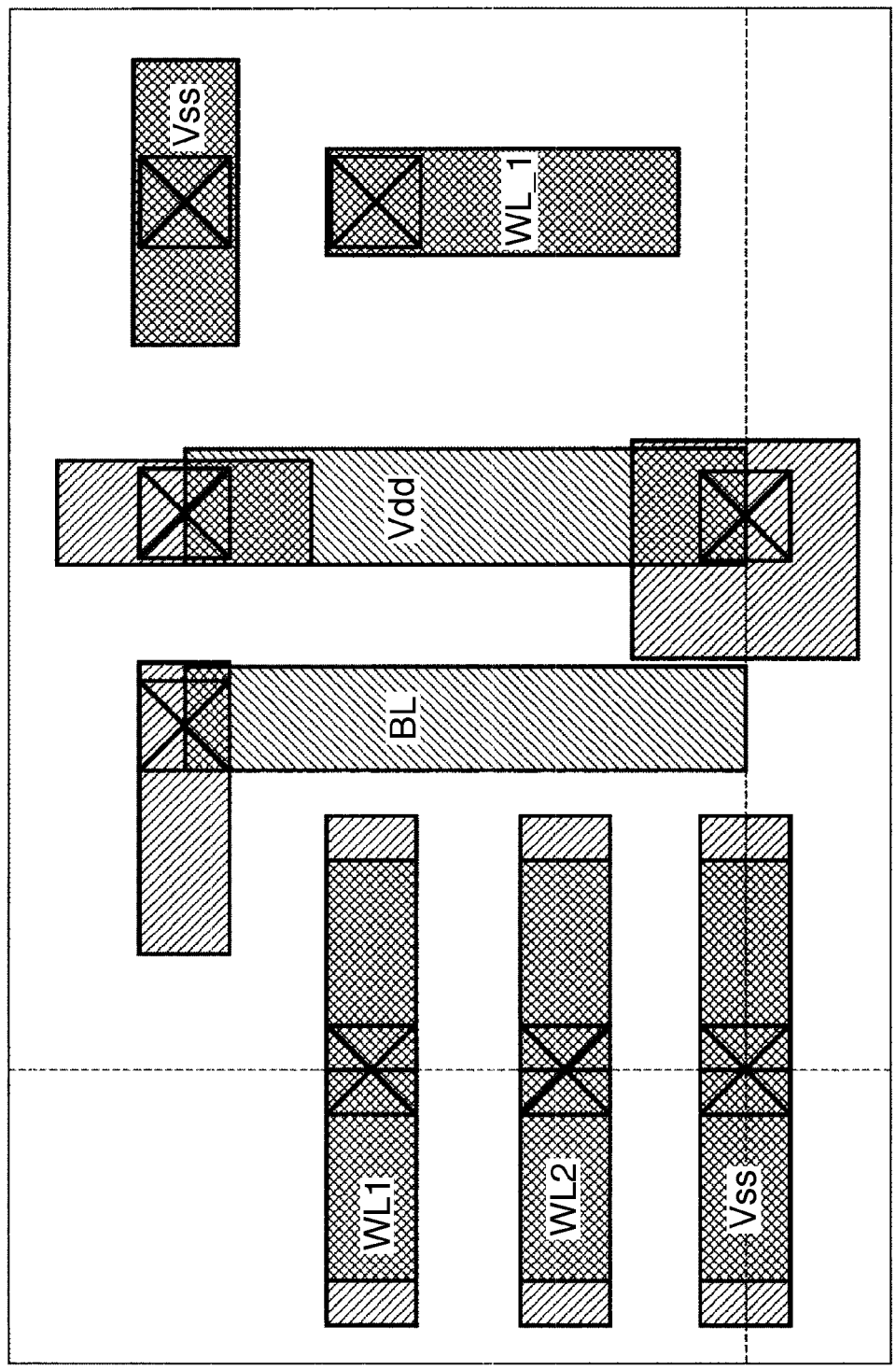
FIG. 22 shows a layout example of the second-metal, a third-contact and a third metal which realizes the circuit of FIG. 9.

FIG. 22 shows a layout example of the second-metal, a third-contact and a third metal which realizes the circuit of FIG. 9.

Figure 23:
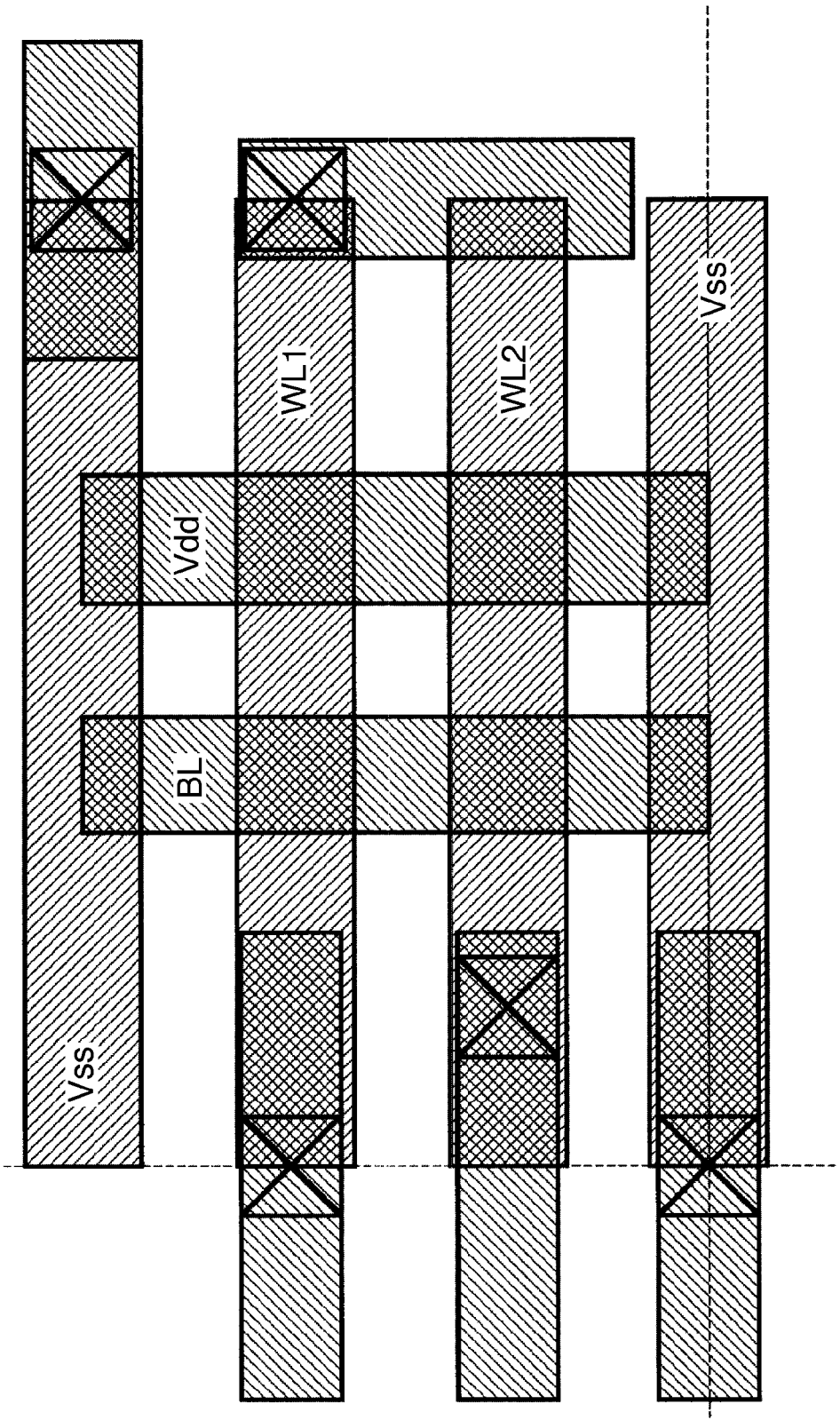
FIG. 23 shows a layout example of the third metal, a fourth-contact and a fourth-metal which realizes the circuit of FIG. 9.

FIG. 23 shows a layout example of the third metal, a fourth-contact and a fourth-metal which realizes the circuit of FIG. 9.

As described above, according to the embodiment, the effect of characteristic variations of transistors can be reduced by allowing the bit line to be one line such as the 5Tr-SRAM.

Though the data write characteristic is not stable in the 5Tr-SRAM, in the embodiment, two word lines are provided as well as the NMOS transistor NT33 (Vss side) for controlling data writing and the PMOS transistor (power supply side) are added to the first inverter INV31 to which the bit line BL11 is connected, which realizes stable write operation at the time of low-voltage operation.

According to this, a static memory cell which operates stably even in the low voltage can be realized.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor storage device comprising:
   a bit line;
   a first word line;
   a second word line;
   a first inverter in which one terminal of a first conductive-type first load transistor is connected to one terminal of a second conductive-type first driver transistor and a junction point therebetween forms a first node;
   a second inverter in which one terminal of a first conductive-type second load transistor is connected to one terminal of a second conductive-type second driver transistor and a junction point therebetween forms a second node;
   a first write transistor one terminal of which is connected to the other terminal of the first load transistor and the other terminal of which is connected to a power supply voltage;
   a second write transistor one terminal of which is connected to the other terminal of the first driver transistor and the other terminal is connected to a reference potential; and
   an access transistor which is a second conductive-type, one terminal of which is connected to the first node and the other terminal of which is connected to the bit line,
   wherein control terminals of the first load transistor and the first driver transistor are connected to the second node,
   wherein control terminals of second load transistor and the second driver transistor are connected to the first node,
   wherein a control terminal of the first write transistor and a control terminal of the access transistor are connected to the first word line; and
   wherein a control terminal of the second write transistor is connected to the second word line.

2. The semiconductor storage device according to claim 1, wherein, at the time of a data holding state,
   the first write transistor is maintained in an ON state and the access transistor is maintained in an OFF state by the first word line, and
   the second write transistor is maintained in an ON state by the second word line.

3. The semiconductor storage device according to claim 1, wherein, at the time of a data write operation of a first level,
   the bit line is set at the first level,
   the first write transistor is maintained in an OFF state and the access transistor is maintained in an ON state by the first word line, and
   the second write transistor is maintained in an OFF state by the second word line.

4. The semiconductor storage device according to claim 1, wherein, at the time of a data write operation of a second level,
   the bit line is set at the second level, the first write transistor is maintained in an OFF state and
the access transistor is maintained in an ON state by the
first word line, and
the second write transistor is maintained in an OFF state by
the second word line.

5. The semiconductor storage device according to claim 1,
wherein, at the time of a data read operation,
the bit line is set at the second level,
the first write transistor is maintained in an OFF state and
the access transistor is maintained in an ON state by the
first word line, and
the second write transistor is maintained in an ON state by
the second word line.

6. The semiconductor storage device according to claim 1,
wherein, at the time of a data holding state,
the first write transistor is maintained in an ON state and the
access transistor is maintained in an OFF state by the
first word line,
the second write transistor is maintained in an ON state by
the second word line,
wherein, at the time of a data write operation of a first level,
the bit line is set at the first level,
the first write transistor is maintained in an OFF state and
the access transistor is maintained in an ON state by the
first word line, and
the second write transistor is maintained in an OFF state by
the second word line,
wherein, at the time of a data write operation of a second
level,
the bit line is set at the second level,
the first write transistor is maintained in an OFF state and
the access transistor is maintained in an ON state by the
first word line, and
the second write transistor is maintained in an OFF state by
the second word line, and
wherein, at the time of a data read operation,
the bit line is set at the second level,
the first write transistor is maintained in an OFF state and
the access transistor is maintained in an ON state by the
first word line, and
the second write transistor is maintained in an ON state by
the second word line.

7. A semiconductor storage device, comprising:
a memory cell array portion in which memory cells are
arranged in a matrix state;
first word lines and second word lines arranged at respective rows so as to correspond to row arrangement of the
memory cells;
bit lines arranged at respective columns so as to correspond
to column arrangement of the memory cells;
word drivers capable of setting levels of the selected first
word line and the second word line respectively; and
a column circuit capable of setting a potential of the
selected bit line according to operations, and
wherein the memory cell includes
a first inverter in which one terminal of a first conductive-type first load transistor is connected to one terminal of
a second conductive-type first driver transistor and a
junction point therebetween forms a first node,
a second inverter in which one terminal of a first conductive-type second load transistor is connected to one terminal of a second conductive-type second driver transistor and a junction point therebetween forms a second
node;
a first write transistor one terminal of which is connected to
the other terminal of the first load transistor and the other
terminal of which is connected to a power supply voltage;
a second write transistor one terminal of which is connected to the other terminal of the first driver transistor
and the other terminal is connected to the reference
potential; and
an access transistor which is a second conductive-type, one
terminal of which is connected to the first node and the
other terminal of which is connected to the bit line,
wherein control terminals of the first load transistor and the
first driver transistor are connected to the second node,
wherein control terminals of second load transistor and the
second driver transistor are connected to the first node,
wherein a control terminal of the first write transistor and a
control terminal of the access transistor are connected to
a corresponding first word line; and
wherein a control terminal of the second write transistor is
connected to a corresponding second word line.

8. An operation method of a semiconductor storage device
which includes
a bit line,
a first word line,
a second word line,
a first inverter in which one terminal of a first conductive-type first load transistor is connected to one terminal of
a second conductive-type first driver transistor and a
junction point therebetween forms a first node,
a second inverter in which one terminal of a first conductive-type second load transistor is connected to one terminal of a second conductive-type second driver transistor and a junction point therebetween forms a second
node,
a first write transistor one terminal of which is connected to
the other terminal of the first load transistor and the other
terminal of which is connected to a power supply voltage,
a second write transistor one terminal of which is connected to the other terminal of the first driver transistor
and the other terminal is connected to the reference
potential, and
an access transistor which is a second conductive-type, one
terminal of which is connected to the first node and the
other terminal of which is connected to the bit line,
in which control terminals of the first load transistor and the
first driver transistor are connected to the second node,
in which control terminals of second load transistor and the
second driver transistor are connected to the first node,
in which a control terminal of the first write transistor and
a control terminal of the access transistor are connected
to the first word line; and
in which a control terminal of the second write transistor is
connected to the second word line, the method comprising the steps of:
maintaining the first write transistor in an ON state and
maintaining the access transistor in an OFF state by the
first word line as well as
maintaining the second write transistor in an ON state by
the second word line at the time of a data holding state;
setting the bit line at a first level,
maintaining the first write transistor in an OFF state and
maintaining the access transistor in an ON state by the
first word line as well as
maintaining the second write transistor in an OFF state by
the second word line at the time of a data write operation
of the first level;

setting the bit line at a second level, maintaining the first write transistor in an OFF state and maintaining the access transistor in an ON state by the first word line as well as maintaining the second write transistor in an OFF state by the second word line at the time of a data write operation of the second level; and setting the bit line at the second level, maintaining the first write transistor in an OFF state and maintaining the access transistor in an ON state by the first word line as well as maintaining the second write transistor in an ON state by the second word line at the time of a data read operation.

* * * * *